United States Patent
Park

(10) Patent No.: US 9,343,703 B2
(45) Date of Patent: May 17, 2016

(54) ORGANIC LIGHT-EMITTING DEVICE HAVING LOW TEMPERATURE VISCOSITY TRANSITION (LVT) INORGANIC MATERIAL

(71) Applicant: Samsung Display Co., Ltd., Yongin-si, Gyeonggi-do (KR)

(72) Inventor: Jin-Woo Park, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/341,663

(22) Filed: Jul. 25, 2014

(65) Prior Publication Data

US 2014/0332785 A1    Nov. 13, 2014

Related U.S. Application Data

(62) Division of application No. 13/607,638, filed on Sep. 7, 2012, now Pat. No. 8,791,452.

(30) Foreign Application Priority Data

Mar. 5, 2012 (KR) .......... 10-2012-0022519

(51) Int. Cl.
*H01L 29/08* (2006.01)
*H01L 29/04* (2006.01)
*H01L 27/15* (2006.01)
(Continued)

(52) U.S. Cl.
CPC ............ *H01L 51/5256* (2013.01); *C03C 17/42* (2013.01); *C03C 27/10* (2013.01); *H01L 27/15* (2013.01); *H01L 29/06* (2013.01); *H01L 29/08* (2013.01); *H01L 51/0096* (2013.01); *H01L 51/5253* (2013.01); *C03C 2218/34* (2013.01); *Y10T 156/10* (2015.01); *Y10T 428/31678* (2015.04)

(58) Field of Classification Search
CPC ......... H01L 27/15; H01L 51/56; H01L 29/06; H01L 51/5253; H01L 29/08; H01L 51/5256; H01L 51/0096; Y10T 156/10; H01J 1/62; H01J 63/04
USPC .............. 257/40, E51.018, 59, 88, 98, 99, 79, 257/E33.026; 313/504; 438/26
See application file for complete search history.

(56) References Cited

U.S. PATENT DOCUMENTS 7,268,486 B2   9/2007 Ottermann et al.
7,615,506 B2   11/2009 Aitken et al.
(Continued)

FOREIGN PATENT DOCUMENTS

KR    10-0563057    3/2006
KR    10-0942038    2/2010
(Continued)

OTHER PUBLICATIONS

KIPO Notice of Allowance dated Sep. 27, 2013, for Korean priority Patent application 10-2012-0022519, (2 pages).
(Continued)

*Primary Examiner* — Long K Tran
*Assistant Examiner* — Dzung Tran
(74) *Attorney, Agent, or Firm* — Lewis Roca Rothgerber Christie LLP

(57) ABSTRACT

A method of preparing an organic light-emitting device having excellent sealing characteristics against external environment and flexibility.

15 Claims, 16 Drawing Sheets

(51) Int. Cl.
*H01L 33/00* (2010.01)
*H01L 51/52* (2006.01)
*H01L 29/06* (2006.01)
*H01L 51/00* (2006.01)
*C03C 17/42* (2006.01)
*C03C 27/10* (2006.01)

(56) References Cited

U.S. PATENT DOCUMENTS

| | | |
|---|---|---|
| 7,749,811 B2 | 7/2010 | Aitken et al. |
| 7,828,618 B2 | 11/2010 | Park et al. |
| 8,084,380 B2 | 12/2011 | Aitken |
| 2002/0140347 A1* | 10/2002 | Weaver ................. 313/506 |
| 2004/0108811 A1 | 6/2004 | Klausmann et al. |
| 2004/0195967 A1* | 10/2004 | Padiyath et al. ......... 313/512 |
| 2004/0229051 A1 | 11/2004 | Schaepkens et al. |
| 2004/0232833 A1* | 11/2004 | Menda et al. ........... 313/512 |
| 2005/0285513 A1* | 12/2005 | Choi et al. ............. 313/504 |
| 2006/0100299 A1 | 5/2006 | Malik et al. |
| 2007/0040501 A1 | 2/2007 | Aitken et al. |
| 2007/0170423 A1 | 7/2007 | Choi et al. |
| 2007/0252526 A1 | 11/2007 | Aitken et al. |
| 2008/0138653 A1 | 6/2008 | Lee et al. |
| 2008/0143247 A1 | 6/2008 | Kim et al. |
| 2008/0290798 A1 | 11/2008 | Quesada |
| 2009/0051274 A1 | 2/2009 | Hayashi |
| 2009/0069164 A1 | 3/2009 | Lamberson et al. |
| 2009/0121333 A1 | 5/2009 | Aitken et al. |
| 2010/0171106 A1 | 7/2010 | Jung et al. |
| 2010/0304513 A1 | 12/2010 | Nguyen et al. |
| 2011/0140164 A1 | 6/2011 | Seo et al. |
| 2011/0156062 A1* | 6/2011 | Kim et al. .................. 257/88 |
| 2011/0157540 A1* | 6/2011 | Jung et al. ................ 349/194 |
| 2011/0291117 A1 | 12/2011 | Kwack et al. |
| 2012/0132930 A1 | 5/2012 | Young et al. |
| 2012/0139821 A1 | 6/2012 | Kim et al. |
| 2013/0330531 A1* | 12/2013 | Moro et al. ............... 428/218 |
| 2014/0027739 A1* | 1/2014 | van de Weijer et al. ....... 257/40 |

FOREIGN PATENT DOCUMENTS

| | | |
|---|---|---|
| KR | 10-2010-0050470 | 5/2010 |
| KR | 10-2010-0064870 | 6/2010 |
| KR | 10-2010-0081773 | 7/2010 |
| KR | 10-2011-0067411 | 6/2011 |
| KR | 10-2011-0130928 | 12/2011 |
| WO | WO 2008/069930 A2 | 6/2008 |
| WO | WO 2011/114335 A1 | 9/2011 |

OTHER PUBLICATIONS

EPO Search Report dated Jun. 28, 2013, for corresponding European Patent application 12192714.9, (8 pages).

* cited by examiner

ORGANIC LIGHT-EMITTING DEVICE HAVING LOW TEMPERATURE VISCOSITY TRANSITION (LVT) INORGANIC MATERIAL

CROSS-REFERENCE TO RELATED PATENT APPLICATION

This application is a divisional of U.S. patent application Ser. No. 13/607,638, filed Sep. 7, 2012, which claims priority to and the benefit of Korean Patent Application No. 10-2012-0022519, filed Mar. 5, 2012, the entire content of both of which is incorporated herein by reference.

BACKGROUND

1. Field

Embodiments of the present invention relate to a method of preparing an organic light-emitting device, a substrate for transiting an inorganic layer, and an organic light-emitting device.

2. Description of the Related Art

Organic light emitting devices, which are self-emitting devices, have advantages such as a wide viewing angle, excellent contrast, quick response, high brightness, excellent driving voltage characteristics, and can display multicolored images.

The organic light-emitting device includes an organic emission unit including a first electrode, an organic layer, and a second electrode. Since the organic emission unit is vulnerable to an external environment, for example, oxygen and moisture, a sealing structure that seals the organic emission unit from the external environment is used.

Meanwhile, there is a desire to develop a thin organic light-emitting device and/or a flexible organic light-emitting device.

SUMMARY

According to an embodiment of the present invention, there is provided a method of preparing an organic light-emitting device, the method including: forming at least one pre-inorganic layer including a low temperature viscosity transition (LVT) inorganic material on a second substrate; forming at least one organic emission unit on a first substrate; applying an adhesive to edge portions of at least one of the second substrate or the first substrate; bonding the second substrate and the first substrate using the adhesive such that the pre-inorganic layer and the organic emission unit face each other; and transiting the pre-inorganic layer to an inorganic layer to cover the organic emission unit by performing a healing process on the pre-inorganic layer at a temperature greater than a viscosity transition temperature of the LVT inorganic material.

According to another embodiment of the present invention, there is provided a method of preparing an organic light emitting device, the method including: forming at least one pre-inorganic layer including a low temperature viscosity transition (LVT) inorganic material on a second substrate; forming at least one organic emission unit on a first substrate; forming at least one first organic layer on both the first substrate and the organic emission unit to cover the organic emission unit; applying an adhesive to edge portions of at least one of the second substrate or the first substrate; bonding the second substrate and the first substrate using the adhesive such that the pre-inorganic layer and the first organic layer face each other; and transiting the pre-inorganic layer to an inorganic layer to cover the first organic layer by performing a healing process on the pre-inorganic layer at a temperature greater than a viscosity transition temperature of the LVT inorganic material.

The method may further include separating the inorganic layer from the second substrate.

The second substrate may include glass, plastic, or metal.

The forming of the organic layer and/or the forming of the first organic layer may include providing a curable precursor, and curing the curable precursor.

The providing of the curable precursor may be performed by using a flash evaporator.

The curing of the curable precursor may be performed by using UV rays, infrared rays, and laser beams.

The forming of the pre-inorganic layer may include: applying a paste including a powder of the LVT inorganic material to the second substrate; and sintering the paste.

The forming of the pre-inorganic layer may include: applying a dispersion including a powder of the LVT inorganic material to the second substrate by spraying; and heat-treating the dispersion.

The bonding of the second substrate and the first substrate may be performed in a vacuum, under a reduced pressure, or in an inert atmosphere in which an influence of moisture or oxygen is substantially eliminated so that the space between the second substrate and the first substrate is substantially maintained in a vacuum.

The viscosity transition temperature of the LVT inorganic material may be a minimum temperature capable of providing fluidity to the LVT inorganic material.

The viscosity transition temperature of the LVT inorganic material may be less than a minimum value of denaturation temperatures of materials contained in the organic emission unit.

The LVT inorganic material may include a tin oxide.

The LVT inorganic material may include at least one selected from the group consisting of a phosphorus oxide, a boron phosphate, a tin fluoride, a niobium oxide, and a tungsten oxide.

The LVT inorganic material may include SnO; SnO and $P_2O_5$; SnO and $BPO_4$; SnO, $SnF_2$, and $P_2O_5$; SnO, $SnF_2$, $P_2O_5$, and NbO; or SnO, $SnF_2$, $P_2O_5$, and $WO_3$.

The transiting may be performed by heat-treating the pre-inorganic layer at a temperature between the viscosity transition temperature of the LVT inorganic material and a minimum value of denaturation temperatures of materials contained in the organic emission layer.

The transiting may include heat-treating the pre-inorganic layer at a temperature between about 80° C. and about 132° C. for about 1 to 3 hours.

The transiting may be performed in a vacuum or in an inert gas atmosphere.

The transiting may include scanning the pre-inorganic layer while irradiating the pre-inorganic layer with a laser beam.

The method may further include forming at least one second organic layer between the second substrate and the pre-inorganic layer.

The separating the inorganic layer from the second substrate may include separating the second organic layer from the second substrate by irradiating the second organic layer with a laser beam.

The second organic layer may cover at least one portion of the inorganic layer.

According to another embodiment of the present invention, there is provided a substrate for transiting an inorganic layer including: a substrate; and at least one inorganic layer formed on one surface of the substrate and including a low temperature viscosity transition (LVT) inorganic material.

The substrate may further include at least one organic layer between the inorganic layer and the substrate.

The organic layer may include a heat-resistant organic material.

The viscosity transition temperature of the LVT inorganic material may be a minimum temperature capable of providing fluidity to the LVT inorganic material.

The LVT inorganic material may include a tin oxide.

The LVT inorganic material may include at least one selected from the group consisting of a phosphorus oxide, a boron phosphate, a tin fluoride, a niobium oxide, and a tungsten oxide.

The LVT inorganic material may include SnO; SnO and $P_2O_5$; SnO, and $BPO_4$; SnO, $SnF_2$, and $P_2O_5$; SnO, $SnF_2$, $P_2O_5$, and NbO; or SnO, $SnF_2$, $P_2O_5$, and $WO_3$.

The second substrate may include glass, plastic, or metal.

According to another embodiment of the present invention, there is provided an organic light-emitting device including: a first substrate; an organic emission unit on one surface of the first substrate; an inorganic layer including a low temperature viscosity transition (LVT) inorganic material and covering the organic emission unit; and a second substrate on the inorganic layer and being in contact with the inorganic layer and facing the first substrate.

The organic light-emitting device may further include a first organic layer between the inorganic layer and the organic emission unit.

The inorganic layer may be transited onto the organic emission unit to cover the organic emission unit.

The organic light-emitting device may further include a second organic layer between the second substrate and the inorganic layer.

The organic light-emitting device may further include an adhesive between the first substrate and the second substrate and disposed outside of the organic emission unit.

The viscosity transition temperature of the LVT inorganic material may be a minimum temperature capable of providing fluidity to the LVT inorganic material.

The LVT inorganic material may include a tin oxide.

The LVT inorganic material may include at least one selected from the group consisting of a phosphorus oxide, a boron phosphate, a tin fluoride, a niobium oxide, and a tungsten oxide.

The LVT inorganic material may include SnO; SnO and $P_2O_5$; SnO, and $BPO_4$; SnO, $SnF_2$, and $P_2O_5$; SnO, $SnF_2$, $P_2O_5$, and NbO; or SnO, $SnF_2$, $P_2O_5$, and $WO_3$.

The second substrate may include glass, plastic, or metal.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, the present invention will be described more fully with reference to the accompanying drawings, in which exemplary embodiments of the invention are shown. As used herein, the term "and/or" includes any and all combinations of one or more of the associated listed items. Expressions such as "at least one of," when preceding a list of elements, modify the entire list of elements and do not modify the individual elements of the list.

Figure 1:
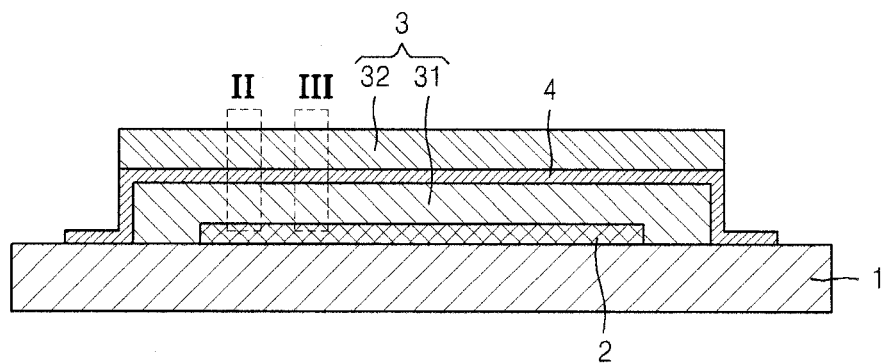
FIG. 1 is a schematic cross-sectional view of an organic light-emitting device according to an embodiment of the present invention.
Figure 2:
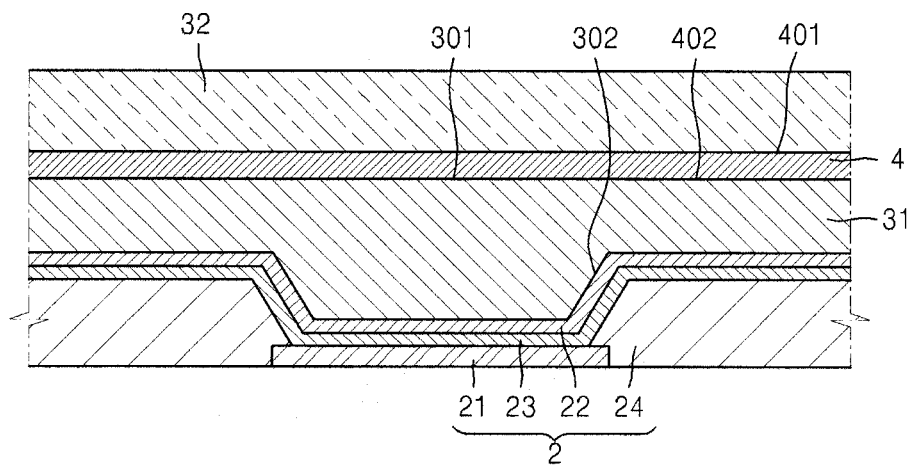
FIG. 2 is a cross-sectional view of a portion II of FIG. 1.

FIG. 1 is a schematic cross-sectional view of an organic light-emitting device according to an embodiment of the present invention. FIG. 2 is a cross-sectional view of a portion II of FIG. 1, and FIG. 3 is a cross-sectional view of a portion III of FIG. 1.

Figure 3:
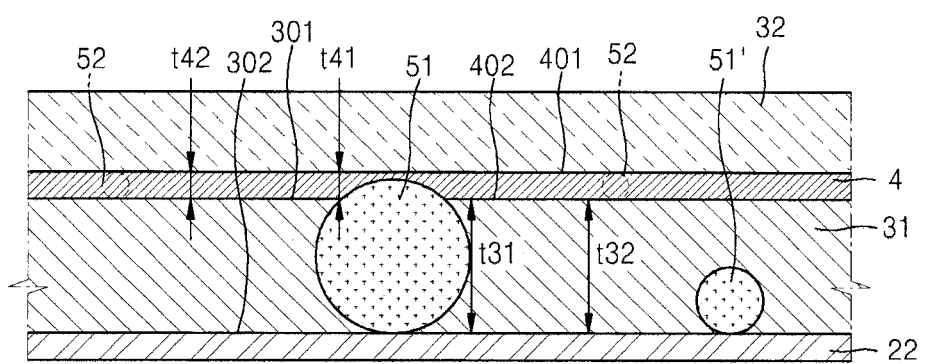
FIG. 3 is a cross-sectional view of a portion III of FIG. 1.

Referring to FIGS. 1 to 3, an organic emission unit 2 is formed on one surface of a first substrate 1, a laminate of an organic layer 3 and an inorganic layer 4, is formed on the first substrate 1 such that the laminate covers the organic emission unit 2.

The first substrate 1 may be formed of glass, but is not limited thereto. The first substrate 1 may also be formed of metal or plastic. The first substrate 1 may be a flexible substrate that is bendable. In one embodiment, a bending radius of the first substrate 1 may be 10 cm or less.

The organic emission unit 2 formed on the first substrate 1 includes a laminate including a first electrode 21, a second electrode 22, and an organic emission layer 23 interposed between the first electrode 21 and the second electrode 22 as shown in FIG. 2.

Although not shown herein, the organic emission unit 2 includes a plurality of pixels and one pixel circuit per pixel, and the pixel circuit may include at least one thin film transistor (TFT) (not shown) and a capacitor (not shown).

The first electrode 21 is electrically connected to the TFT.

The first electrode 21 and the second electrode 22 face each other and are insulated from each other by the organic emission layer 23. Borders of the first electrode 21 may be covered with a pixel defining layer 24, and the organic emission layer 23 and the second electrode 22 are formed on the pixel defining layer 24 and the first electrode 21. The second electrode 22 may be a common electrode for covering all pixels, and the first electrode 21 may be formed in each pixel independent from one another.

The first electrode 21 may be formed by depositing or sputtering a material used to form the first electrode 21 on the substrate 1. When the first electrode 21 is an anode, the material used to form the first electrode 21 may be a high work function material so as to facilitate hole injection. The first electrode 21 may be a reflective, semi-transmissive, or transmissive electrode. Transparent and conductive materials such as indium tin oxide (ITO), indium zinc oxide (IZO), tin oxide ($SnO_2$), and zinc oxide (ZnO) may be used to form the first electrode 21. The first electrode 21 may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 21 may have a single-layered or a multi-layered structure. For example, the first electrode 21 may have a triple-layered structure of ITO/Ag/ITO, but is not limited thereto.

The organic emission layer 23 is formed on the first electrode 21.

The organic emission layer 23 may include at least one layer selected from the group consisting of a hole injection layer, a hole transport layer, a functional layer having both hole injecting and hole transporting capabilities, a buffer layer, an electron blocking layer, an emission layer, a hole blocking layer, an electron transport layer, and an electron injection layer.

For example, the organic emission layer 23 may include at least one of Compounds 301, 311, or 321 below.

301

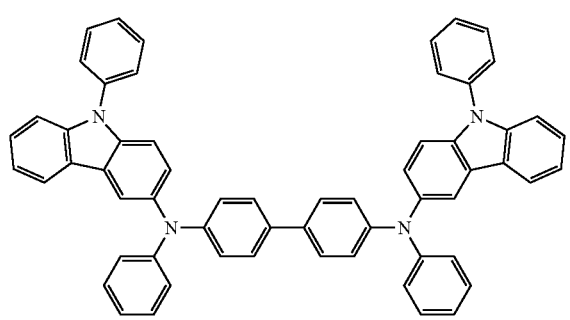

311

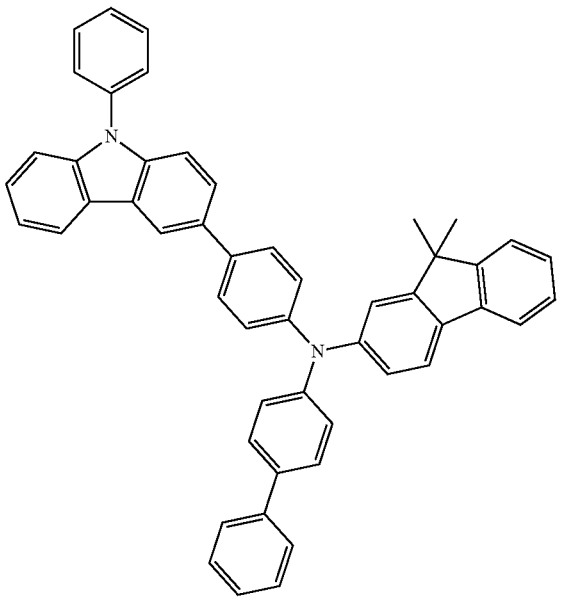

321

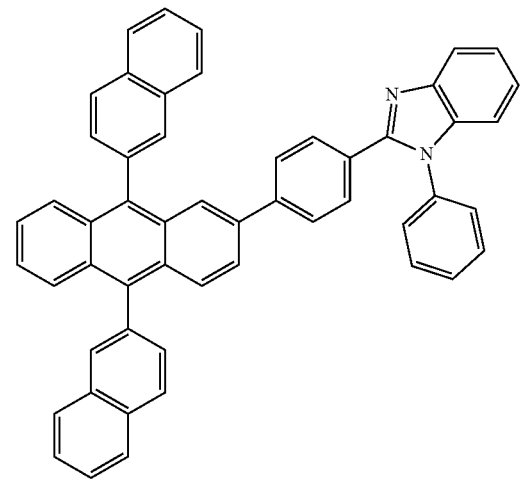

The second electrode 22 is formed on the organic emission layer 23. The second electrode 22 may be a cathode, which is an electron injecting electrode. A material used to form the second electrode 22 may be a metal, an alloy, an electrically conductive compound, which have a low work function, or a mixture thereof. For example, the second electrode 22 may be a reflective, semi-transmissive, or transmissive electrode by forming a thin film by using lithium (Li), magnesium (Mg), aluminum (Al), aluminum-lithium (Al—Li), calcium (Ca), magnesium-indium (Mg—In), magnesium-silver (Mg—Ag), or the like. In order to manufacture a top-emission type organic light-emitting device, a transmissive second electrode 22 formed of ITO or IZO may be used, and various modifications may be applied thereto.

In a bottom emission type organic light-emitting device in which an image is formed toward the first substrate 1, the second electrode 22 may be relatively thick, so that emission efficiency toward the first substrate 1 may be increased.

In a top emission type organic light-emitting device in which an image is formed toward the second electrode 22, the second electrode 22 may be relatively thin, so that the second electrode 22 may be a reflective layer, or the second electrode 22 may be formed of a transparent conductive material. In this case, the first electrode 21 may further include a reflective layer.

Although not shown in FIGS. 1 to 3, a protective layer may be formed on the second electrode 22. For example, the protective layer may be formed of LiF, lithium quinolate, Alg3, or the like.

According to an embodiment described with reference to FIGS. 1 to 3, the organic emission unit 2 is covered with a laminate of a first organic layer 31, the inorganic layer 4, and a second organic layer 32 sequentially stacked, and thus the organic emission unit 2 is sealed from external air by the laminate.

In this regard, the laminate contacts an environmental element 51 or 51' to surround a border of at least one of the environmental element 51 or 51' as shown in FIG. 3.

The environmental element 51 or 51' may be undesirable particles attached during the formation of an organic light-emitting display device and may include an organic material and/or an inorganic material. For example, the environmental element 51 or 51' may be a micro particle from the external environment (e.g., dust and mote existing in the external environment), a micro particle of a material used to form the organic emission unit 2 and remaining on the organic emission unit 2 (e.g., a micro particle formed of a material used to form the second electrode 22 and remaining after the second electrode 22 is formed), or the like. The environmental element 51 or 51' may include various organic materials, inorganic materials, and organic/inorganic complexes.

In FIG. 3, the environmental element 51 or 51' may be disposed on the second electrode 22. Although not shown herein, other environmental elements may be disposed within or under the second electrode 22. The upper surface of the organic emission unit 2 may have a bent portion. Although not shown herein, other environmental elements may be formed on the upper surface 301 of the first organic layer 31.

The environmental element 51 or 51' cannot be removed by a wet process such as washing after the organic emission unit 2 is formed.

The environmental element 51 or 51' has a size in the range of 1 μm to 5 μm. The environmental element 51', which is smaller than the environmental element 51, may be covered with the first organic layer 31, and the environmental element 51 may be exposed through the first organic layer 31. In FIG. 3, the environmental elements 51 and 51' are conceptually illustrated as two spherical particles with different sizes for the convenience of description.

The inorganic layer 4 may cover the environmental element 51 that is not covered with the first organic layer 31 and exposed through the first organic layer 31 because the thickness of the environmental element 51 is greater than that of the first organic layer 31.

The first organic layer 31 may be formed of a polymer material. The polymer material may include an acrylic material. As shown in FIG. 2, the upper surface 301 of the first organic layer 31 may be substantially flat. Here, the lower surface 302 of the first organic layer 31 may not be flat due to the bent portion of the pixel defining layer 24. The substantially flat upper surface 301 and the non-flat lower surface 302 are opposite surfaces of the first organic layer 31.

Since the upper surface 301 of the first organic layer 31 is substantially flat, a thickness t31 of the first organic layer 31 at a perimeter of the environmental element 51 is substantially the same as a thickness t32 of the first organic layer 31 at a portion spaced apart from the environmental element 51, as shown in FIG. 3. This indicates that the organic layer 3 may have a uniform thickness except for the bent portion of the lower surface 302 as shown in FIG. 2. Thus, the entire surface of the organic emission unit 2 may be uniformly protected.

The inorganic layer 4 is formed on the first organic layer 31, and accordingly the inorganic layer 4 contacts the first organic layer 31 in the planar direction.

The inorganic layer 4 may include a low temperature viscosity transition (LVT) inorganic material. The inorganic layer 4 may be formed by being melted and solidified, which will be described later.

The LVT inorganic material is an inorganic material having a low viscosity transition temperature.

As used herein, the "viscosity transition temperature" is not a temperature where the phase of the LVT inorganic material is completely changed from solid to liquid, but is a minimum temperature where the LVT inorganic material has fluidity, i.e., a minimum temperature where the viscosity of the LVT inorganic material changes.

The viscosity transition temperature of the LVT inorganic material may be less than the denaturation temperature of a material contained in the organic emission unit 2. For example, the viscosity transition temperature of the LVT inorganic material may be less than a minimum value of the denaturation temperatures of the materials contained in the organic emission unit 2.

The "denaturation temperature of a material contained in the organic emission unit 2" refers to a temperature capable of causing chemical and/or physical denaturation in the material contained in the organic emission unit 2, and the material may have a plurality of denaturation temperatures according to the type and number of materials contained therein.

For example, the "viscosity transition temperature of the LVT inorganic material" and the "denaturation temperature of the material contained in the organic emission unit 2" may indicate a glass transition temperature Tg of the LVT inorganic material and an organic material contained in the organic layer 23 of the organic emission unit 2. The Tg may be measured by performing thermo gravimetric analysis (TGA) of the LVT inorganic material and the organic material contained in the organic layer 23 of the organic emission unit 2.

For example, the Tg may be obtained from thermal analysis of the material contained in the organic emission unit 2 by using TGA and differential scanning calorimetry (DSC) in an $N_2$ atmosphere at a temperature ranging from room temperature to about 600° C. (10° C./min) for TGA, at a temperature ranging from room temperature to about 400° C. for DSC (Pan Type: Pt Pan in disposable Al Pan (TGA), disposable Al Pan (DSC)), and these conditions will be understood by those of ordinary skill in the art.

The denaturation temperature of the material contained in the organic emission unit 2 may be, but is not limited to, higher than about 130° C., and may be efficiently measured via a TGA analysis of the material contained in the organic emission unit 2 as described above.

The minimum value of the denaturation temperatures of the materials contained in the substrate 1 may be in the range of about 130° C. to about 140° C. The minimum value of the denaturation temperatures of the materials contained in the organic emission unit 2 may be, but is not limited to, about 132° C., and may be efficiently determined by measuring the Tg of the materials contained in the organic emission unit 2 via a TGA analysis of the materials as described above, and choosing the minimum Tg.

For example, the viscosity transition temperature of the LVT inorganic material may be about 80° C. or greater, for example, in the range of about 80° C. to about 132° C., but is not limited thereto. For example, the viscosity transition temperature of the LVT inorganic material may be in the range of about 80° C. to about 120° C. or about 100° C. to about 120° C., but is not limited thereto. For example, the viscosity transition temperature of the LVT inorganic material may be about 110° C.

The LVT inorganic material may be a single compound or a mixture of at least two compounds.

The LVT inorganic material may include a tin oxide such as SnO or $SnO_2$.

If the LVT inorganic material includes SnO, the content of the SnO may be in the range of about 20% by weight to about 100% by weight.

In one embodiment, the LVT inorganic material may further include at least one selected from the group consisting of a phosphorus oxide (e.g., $P_2O_5$), a boron phosphate (e.g., $BPO_4$), a tin fluoride (e.g., $SnF_2$), a niobium oxide (e.g., NbO), and a tungsten oxide (e.g., $WO_3$), but is not limited thereto.

In various embodiments, the LVT inorganic material may include:
 SnO;
 SnO and $P_2O_5$;
 SnO and $BPO_4$;
 SnO, $SnF_2$, and $P_2O_5$;
 SnO, $SnF_2$, $P_2O_5$, and NbO; or
 SnO, $SnF_2$, $P_2O_5$, and $WO_3$,
 but is not limited thereto.

In various embodiments, the LVT inorganic material may include the following ingredients, but is not limited thereto.
 SnO (100 wt %);
 SnO (80 wt %) and $P_2O_5$ (20 wt %);
 SnO (90 wt %) and $BPO_4$ (10 wt %);
 SnO (20-50 wt %), $SnF_2$ (30-60 wt %) and $P_2O_5$ (10-30 wt %), where the weight percent of the sum of SnO, $SnF_2$, and $P_2O_5$ is 100 wt %;
 SnO (20-50 wt %), $SnF_2$ (30-60 wt %), $P_2O_5$ (10-30 wt %) and NbO (1-5 wt %), where the weight percent of the sum of SnO, $SnF_2$, $P_2O_5$, and NbO is 100 wt %; or
 SnO (20-50 wt %), $SnF_2$ (30-60 wt %), $P_2O_5$ (10-30 wt %) and $WO_3$ (1-5 wt %), where the weight percent of the sum of SnO, $SnF_2$, $P_2O_5$, and $WO_3$ is 100 wt %.

In various embodiments, the LVT inorganic material may include SnO (42.5 wt %), $SnF_2$ (40 wt %), $P_2O_5$ (15 wt %), and $WO_3$ (2.5 wt %), but is not limited thereto.

If the inorganic layer 4 has the above-described composition, the viscosity transition temperature may be maintained to be lower than the denaturation temperature of the material contained in the organic emission unit 2, so that various defects that may be formed in the inorganic layer 4 may be rectified by a healing process, which will be described below.

As shown in FIG. 3, the inorganic layer 4 may include a film-forming element 52. The film-forming element 52 may be particles of an inorganic material deposited on the first organic layer 31 during the formation of the inorganic layer 4 and may be rectified by the healing process that will be described below to constitute one portion of the inorganic layer 4.

As shown in FIG. 3, the environmental element 51 is surmounted with the inorganic layer 4, and thus the lower surface 402 of the inorganic layer 4 may not be flat. In more detail, the upper surface 401 of the inorganic layer 4 is substantially flat. This is because the inorganic layer 4 is formed by providing fluidity to the inorganic layer 4 during the healing process and solidifying the inorganic layer 4. Accordingly, the substantially flat upper surface 401 and the non-flat lower surface 402 are opposite surfaces of the inorganic layer 4.

Since the upper surface 401 of the inorganic layer 4 is substantially flat, a thickness t41 of the inorganic layer 4 at a perimeter of the environmental element 51 is substantially the same as a thickness t42 of the inorganic layer 4 at a portion spaced apart from the environmental element 51, as shown in FIG. 3. This indicates that the inorganic layer 4 may have a uniform thickness except for the bent portion of the lower surface 402 as shown in FIG. 3. Thus, the entire surface of the organic emission unit 2 may be uniformly protected.

As shown in FIG. 1, the inorganic layer 4 may have a larger area than that of the first organic layer 31, so that all borders of the inorganic layer 4 contact the first substrate 1. Thus, the first organic layer 31 is completely covered with the inorganic layer 4. Here, since the inorganic layer 4 contacts the first substrate 1, an adhesive strength between the inorganic layer 4 and the first substrate 1 is improved, and infiltration of external air into the organic emission unit 2 may be more efficiently blocked or reduced. Although not shown herein, the organic emission unit 2 may further include a pixel circuit including a TFT as described above, the inorganic layer 4 may contact any insulating layer of the pixel circuit and, for example, the TFT. For example, a portion extending from a gate insulating layer among the layers of the TFT may contact the inorganic layer 4. In this regard, since the insulating layers constituting the TFT is an inorganic insulating layer such as a silicon oxide layer, a silicon nitride layer, or a silicon oxynitride layer, characteristics thereof may be the same as or similar to those when the inorganic layer 4 contacts the first substrate 1.

At least one portion of the inorganic layer 4 is covered with the second organic layer 32.

The first organic layer 31 and the second organic layer 32 may be formed of the same organic material. However, the present invention is not limited thereto, and the second organic layer 32 may include a heat-resistant organic material. In this regard, the heat-resistant organic material may have a composition that is the same as or similar to that of the first organic layer 31.

Figure 4:
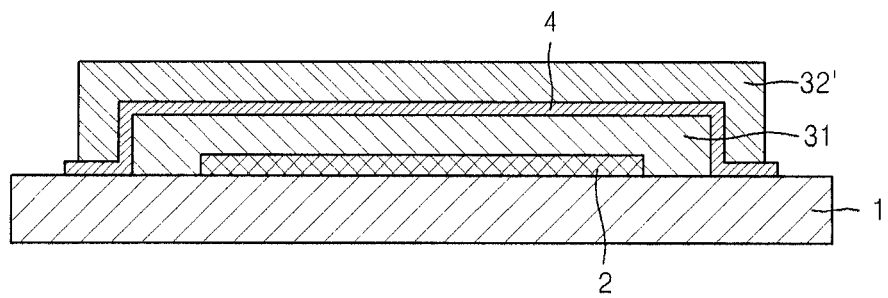
FIG. 4 is a schematic cross-sectional view of an organic light-emitting device according to another embodiment of the present invention.

The structure of the second organic layer 32 may be formed to cover the upper surface of the inorganic layer 4 as shown in FIG. 1, but is not limited thereto. In one embodiment, as shown in FIG. 4, the second organic layer 32' may be formed to cover the entire surface of the inorganic layer 4. In this regard, a second organic layer 32' may not cover a portion of the border of the inorganic layer 4 as shown in FIG. 4, but the present invention is not limited thereto. The second organic layer 32' may completely cover the inorganic layer 4 including the border thereof.

Figure 5:
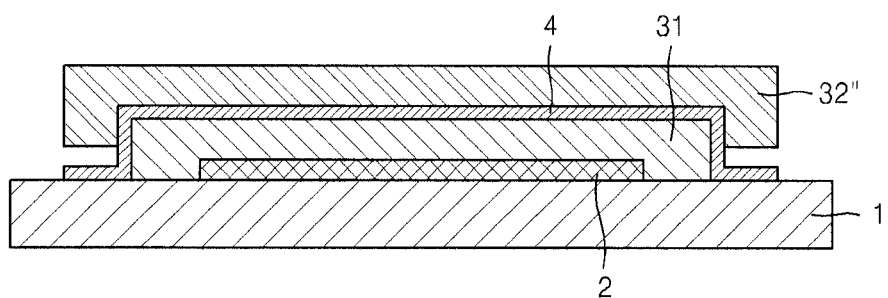
FIG. 5 is a schematic cross-sectional view of an organic light-emitting device according to another embodiment of the present invention.

In one embodiment, as shown in FIG. 5, a second organic layer 32" may be formed to cover the upper surface and a portion of the side of the inorganic layer 4.

The second organic layers 32, 32', and 32" shown in FIGS. 1, 4, and 5, respectively, may protect the inorganic layer 4 from external impact, or the like, and compensate for the bending characteristics of the inorganic layer 4.

Although not shown herein, at least one inorganic layer and/or laminate of the inorganic layer/organic layer may further be formed to cover the second organic layers 32, 32', and 32". The inorganic layer may be formed by using the LVT inorganic material via the healing process, but is not limited thereto. A different inorganic material from the inorganic layer 4, such as a silicon-based oxide, a silicon-based nitride, an aluminum-based oxide, and/or an aluminum-based nitride may also be applied.

A method of preparing the organic light-emitting device of FIG. 1 will be described with reference to FIGS. 6A to 6J.

Figure 6A:
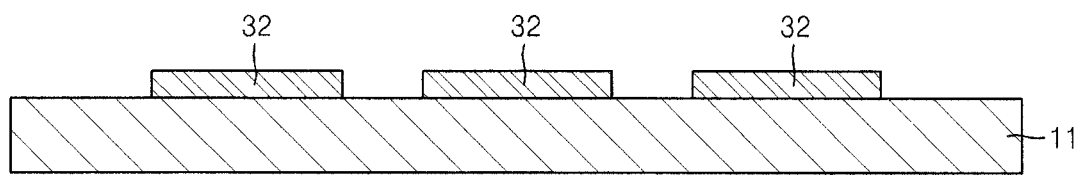
FIGS. 6A through 6J are diagrams for describing a method of preparing the organic light-emitting device of FIG. 1.

First, at least one second organic layer 32 is formed on a second substrate 11. In FIG. 6A, three second organic layers 32 are formed on the second substrate 11, but the present invention is not limited thereto as longus at least one second organic layer 32 is formed on the second substrate 11. If a plurality of second organic layers 32 are formed on the second substrate 11, a plurality of organic light-emitting devices may be concurrently (e.g., simultaneously) prepared, thereby increasing productivity.

The second substrate 11 may be a transparent glass substrate, but is not limited thereto, and may instead be a plastic substrate.

The second organic layer 32 is formed on a preselected or predetermined region of the second substrate 11 by using, for example, a screen printing or slit coating process. The second organic layer 32 may be formed of a transparent acrylic or heat-resistant polymer to a thickness in the range of about 1 $\mu$m to about 100 $\mu$m, but is not limited thereto. As described above, the second organic layer 32 may be formed of the same material used to form the first organic layer 31.

The second organic layer 32 may isolate the inorganic layer 4 from the second substrate 11 and/or planarize the second substrate 11, which will be described below. The second organic layer 32 may include a heat-resistant organic material in order to prevent the second organic layer 32 from being damaged when the inorganic layer 4 is separated from the second substrate 11 by using laser beams.

In various embodiments, the second organic layer 32 may have a thickness in the range of about 1 $\mu$m to about 100 $\mu$m. As shown in FIG. 6A, since the second organic layer 32 is partially coated on the second substrate 11, the edges of the second organic layer 32 may extent at a right angle with respect to the surface of the second substrate 11 which is different from the first organic layer 31 and will be described below.

Since the area of the second organic layer 32 is greater than that of an inorganic paste 4' that will be described below, the second organic layer 32 may completely cover the inorganic paste 4'. However, the present invention is not limited thereto. In several embodiments, the area of the second organic layer 32 may be less than that of the inorganic paste 4', so that the inorganic paste 4' may completely cover the second organic layer 32.

The second organic layer 32 of FIG. 6A that is formed as a substantially flat layer is an exemplary structure for preparing the organic light-emitting device of FIG. 1, but the present invention is not limited thereto. For example, in the organic light-emitting devices shown in FIG. 4 and/or FIG. 5, the center of the second organic layer 32 may be recessed.

Figure 6B:
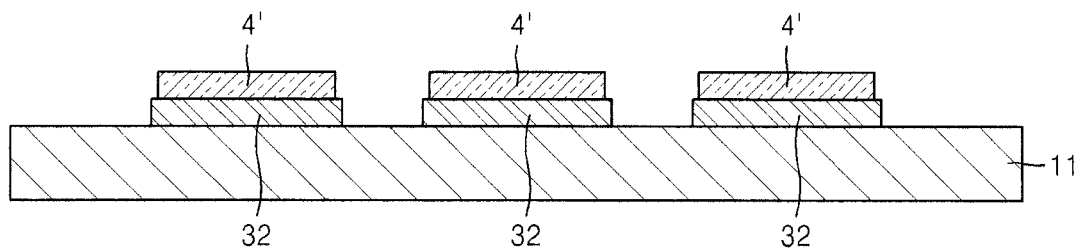

Then, the inorganic paste 4' including the LVT inorganic material may be printed on each of the second organic layers 32 as shown in FIG. 6B.

The inorganic paste 4' includes the LVT inorganic material. According to an embodiment, the inorganic paste 4' includes the LVT inorganic material including SnO, $SnF_2$, $P_2O_5$, or $WO_3$, or a combination thereof. Powder of the LVT inorganic material is mixed and melted at about 500° C. for about 1 hour, and then quickly cooled to obtain a substantially homogeneous vitreous material. The vitreous material is pulverized to powder. The powder was mixed with proper amounts of a binder and a solvent to prepare the inorganic paste 4' having a preselected or predetermined viscosity. The binder may include ethylcellulose and the solvent may include terpineol. The viscosity of the inorganic paste 4' may be in the range of about 10,000 CP to about 100,000 CP.

In one embodiment, the inorganic paste 4' having a viscosity in the range of about 20,000 CP to about 100,000 CP is printed to a thickness in the range of about 3 $\mu$m to 10 $\mu$m. The printing may be performed by using screen printing or slit coating. In the slit coating, desired regions may be coated by partially opening slits.

Figure 6C:
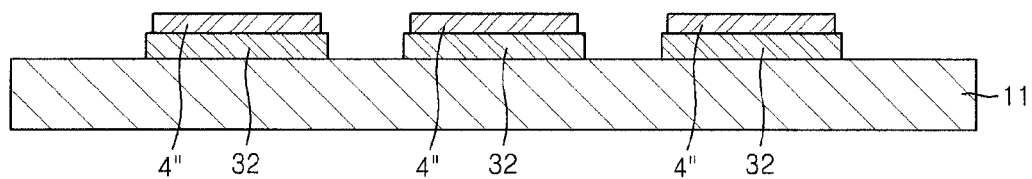

Then, as shown in FIG. 6C, the printed inorganic paste 4' is sintered in an $N_2$ atmosphere, in a vacuum, or in an Ar atmosphere to remove the solvent and binder contained in the inorganic paste 4', and then the resultant paste is sintered by a heat-treatment to form a pre-inorganic layer 4". After the sintering, the surface of the pre-inorganic layer 4" has a vitreous surface having a preselected or predetermined homogeneity.

The inorganic paste 4' may be a layer formed by spray-coating a dispersion including the powder of the LVT inorganic material on the second organic layer 32. In this regard, the pre-inorganic layer 4" may be formed by a heat-treatment instead of the sintering and/or calcinating of the inorganic paste 4' formed of the dispersion.

FIGS. 6B and 6C show a method of printing the pre-inorganic layer 4" using the inorganic paste 4', but the present invention is not limited thereto. The LVT inorganic material may be applied onto the second organic layer 32 by using sputtering, vacuum deposition, low temperature deposition, plasma chemical vapor deposition (PCVD), plasma-ion assisted deposition (PIAD), flash evaporator, E-beam coating, or ion plating. In this embodiment, the LVT material is applied only to a preselected or predetermined region, for example, only on the second organic layer 32, using a mask.

Figure 6D:
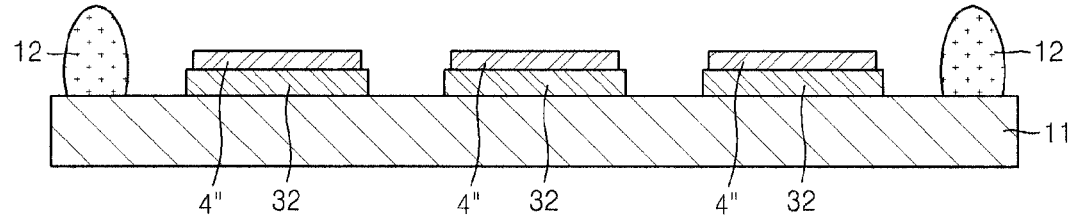

As shown in FIG. 6D, an adhesive 12 is applied to edge portions of the second substrate 11. The adhesive 12 is formed in a closed loop shape in which the second organic layers 32 and the pre-inorganic layers 4" are disposed.

Figure 6E:
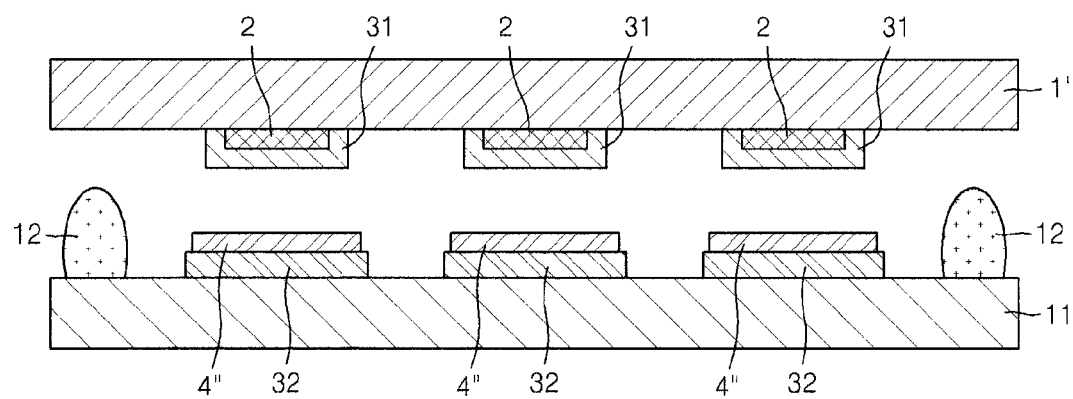

Then, as shown in FIG. 6E, a mother substrate 1' on which the organic emission unit 2 and the first organic layer 31 are formed is prepared. The organic emission unit 2 is described above.

The forming of the first organic layer 31 may include providing a curable precursor of the first organic layer 31 and curing the curable precursor.

The precursor may be a thermosetting or photocurable precursor having a viscosity ranging from about 1 cp to about 100 cp at room temperature and a boiling point ranging from about 300° C. to about 500° C. For example, the precursor may be an acrylate precursor such as mono-acrylate, dimethacrylate, and triacrylate, but is not limited thereto. The curable precursor may be a single compound or a mixture of at least two different compounds.

The curable precursor may be provided onto the organic emission unit 2 by using a flash evaporating method, but the present invention is not limited thereto.

Then, the curable precursor provided onto the organic emission unit 2 is cured by using a known curing method. For example, the precursor may be cured by UV rays, infrared rays, and laser beams to form the first organic layer 31, but the present invention is not limited thereto.

The thickness of the first organic layer 31 may be in the range of about 1 $\mu$m to about 10 $\mu$m. If the thickness of the first organic layer 31 is within the range described above, at least one portion of the environmental element 51 or 51' is covered with the first organic layer 31, and bending characteristics of the inorganic layer 4 may be improved.

According to an embodiment, a curable precursor mixture including mono-acrylate, dimethacrylate, and triacrylate at an appropriate weight ratio, which has a viscosity ranging from about 1 cp to about 100 cp at room temperature, and a boiling point ranging from about 300° C. to about 500° C., may be formed on the organic emission unit 2, as a curable precursor, by using a flash evaporating method (film-forming rate: about 200 Å/s and film-forming time: 3 to 4 min). In this regard, the curable precursor mixture is condensed to a liquid phase as soon as the curable precursor mixture is provided onto the organic emission unit 2, and thus at least one portion of the surface of the environmental element 51 or 51' is surrounded by the curable precursor without an empty space between the environmental elements 51 and 51'. Then, the curable precursor mixture provided onto the organic emission unit 2 is cured to form the first organic layer 31 by using, for example, a UV curing device (wavelength: 390 nm and light quantity: 500 mJ).

Then, the mother substrate 1' is disposed opposite to the second substrate 11, so that each of the first organic layers 31 faces a corresponding one of the pre-inorganic layers 4".

Figure 6F:
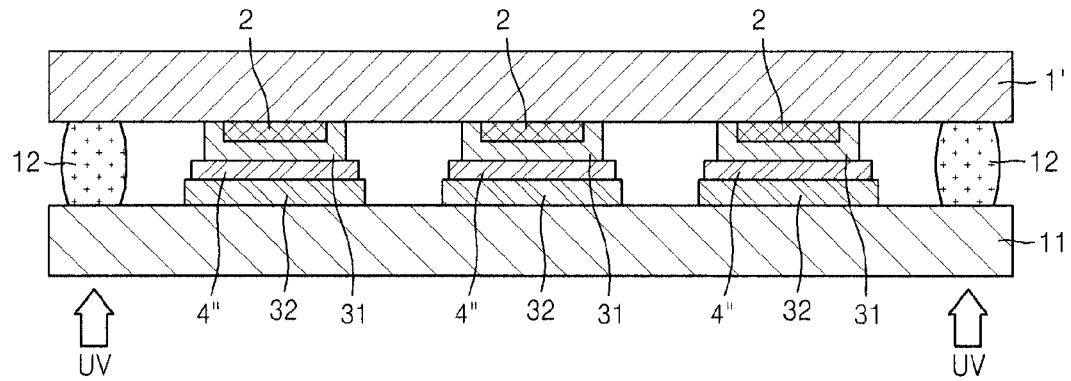

Then, as shown in FIG. 6F, the mother substrate 1' and the second substrate 11 are bonded to each other by the adhesive 12. The bonding process may be performed in a vacuum or under a reduced pressure, and accordingly, the space between the mother substrate 1' and the second substrate 11 is vacuumed or is in a reduced pressure. For example, such vacuum bonding may be performed in a pressure of about 20 Kpa or less. In this regard, each of the first organic layers 31 is in contact with a corresponding one of the pre-inorganic layers 4".

The bonding process includes curing the adhesive 12 by irradiating the adhesive 12 with UV rays.

Figure 6G:
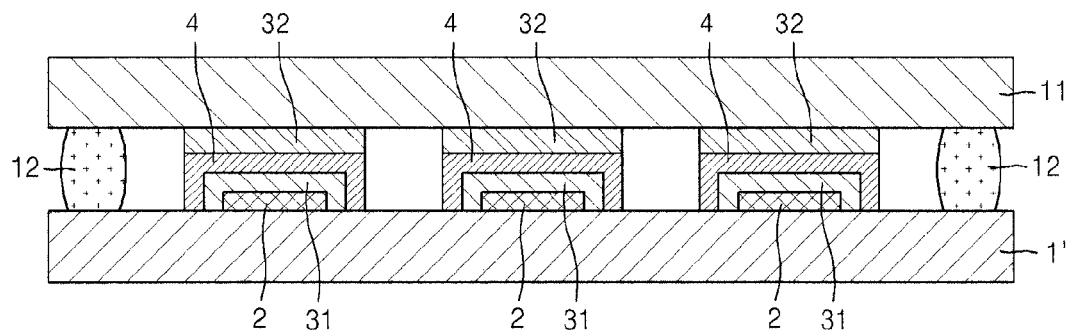
Figure 6H:
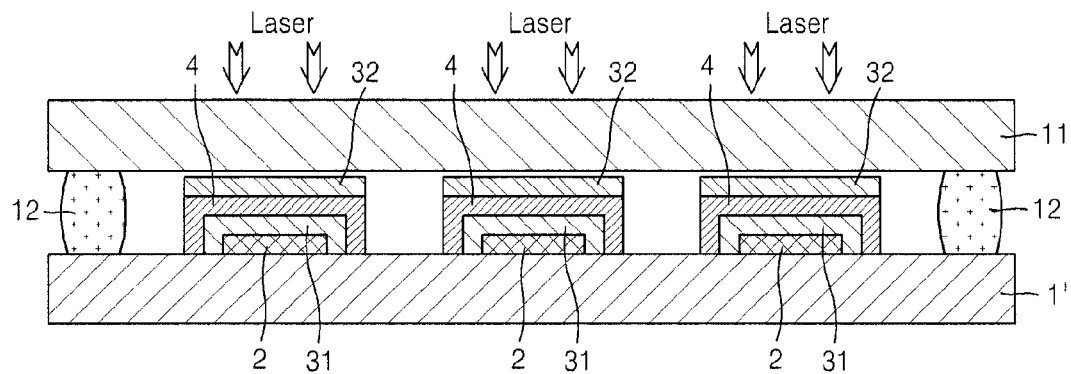

As shown in FIG. 6G, the assembly of the mother substrate 1' and the second substrate 11 is turned over, and then a healing process is performed on the pre-inorganic layers 4", so that the pre-inorganic layers 4" are transited to the first organic layers 31 to form the inorganic layers 4 covering the first organic layers 31 (Refer to FIG. 6H). The healing process may include first and second healing processes.

The first healing process is performed at a temperature greater than the viscosity transition temperature of the LVT inorganic material. For example, the first healing process may be performed by heat-treating the pre-inorganic layer 4' at a temperature in the range of the viscosity transition temperature of the LVT inorganic material to the denaturation temperature of a material contained in the organic emission unit 2.

Alternatively, the first healing process may be performed by heat-treating the pre-inorganic layer 4" at a temperature in the range of the viscosity transition temperature of the LVT inorganic material to a minimum value of the denaturation temperatures of the materials contained in the organic emission unit 2. Alternatively, the first healing process may be performed at the viscosity transition temperature of the LVT inorganic material.

The viscosity transition temperature of the LVT inorganic material may vary according to the composition of the LVT inorganic material, and the denaturation temperature of the material contained in the organic emission unit 2 and the minimum value of the denaturation temperatures of the materials contained in the organic emission unit 2 may vary according to the material used in the organic emission unit 2. However, they will be easily understood by those of ordinary skill in the art according to the composition of the LVT inorganic material and the material used in the organic emission unit 2, for example, by using a Tg evaluation obtained from TGA analysis results of the materials contained in the organic emission unit 2.

In several embodiments, the first healing process may be performed by heat-treating the pre-inorganic layer 4" at a temperature in the range of about 80° C. to about 132° C., for example, in the range of about 80° C. to about 120° C. or about 100° C. to about 120° C., for 1 to 3 hours, for example, at about 110° C. for 2 hours, but is not limited thereto. If the first healing process is within the range described in the above examples, the LVT inorganic material of the pre-inorganic layer 4" may be fluidized, and the denaturation of the organic emission unit 2 may be prevented.

The first healing process may be performed in a vacuum or in an inert gas atmosphere, for example $N_2$ atmosphere or Ar atmosphere, using an IR oven.

The LVT inorganic material contained in the pre-inorganic layer 4" may be fluidized by the first healing process. The fluidized LVT inorganic material may have flowability. Thus, during the first healing process, the fluidized LVT inorganic material of the pre-inorganic layer 4" flows to surround the first organic layer 31. Accordingly, the inorganic layer 4 is formed to completely surround the first organic layer 31 and be bonded to the mother substrate 1'. Since the space between the second substrate 11 and the mother substrate 1' is maintained in a vacuum, the inorganic layer 4 may be in contact with the mother substrate 1' without voids formed between them.

In addition, as shown in FIG. 3, the inorganic layer 4 is in contact with the mother substrate 1' so as to surround the environmental element 51, and the fluidized LVT inorganic material flows into the defects such as pin holes or voids of the inorganic layer 4. Thus, the inorganic layer 4 from which the defects are substantially removed may be prepared.

The inorganic layer 4 may include a region having a weak binding force between the environmental element 51 or 51' and the LVT inorganic material, or among the LVT inorganic materials. The region having a weak binding force between the environmental element 51 or 51' and the LVT inorganic material, or among the LVT inorganic materials, may provide an entry for external environmental materials such as moisture and oxygen while the organic light-emitting device is stored or operates to induce the formation of a progressive dark spot, so that the lifespan of the organic light-emitting device may be reduced.

Accordingly, a second healing process is performed to remove a region having a weak binding force between the environmental element 51 or 51' and the LVT inorganic material or among the LVT inorganic materials, by accelerating vigorous substitution reaction between the environmental element 51 or 51' and the LVT inorganic material and among the LVT inorganic materials, and improving heat resistance and mechanical strength of the inorganic layer 4.

The second healing process may be performed by using a chemical treatment, a plasma treatment, a hot chamber treatment including oxygen, or a hot chamber treatment including oxygen and moisture.

In one embodiment, the second healing process may be performed by using a chemical treatment by which the inorganic layer 4 is treated with at least one of an acidic solution, an alkaline solution, or a neutral solution. In this regard, the alkaline solution may be a nitrate solution, e.g., a potassium nitrate solution.

In another embodiment, the second healing process may be performed by using a plasma treatment by which the inorganic layer 4 is treated using at least one of an $O_2$ plasma, a $N_2$ plasma, or an Ar plasma in a vacuum.

In another embodiment, the second healing process may be performed by using a plasma treatment by which the inorganic layer 4 is treated using at least one of an $O_2$ plasma, a $N_2$ plasma, or an Ar plasma under atmospheric pressure.

In another embodiment, the second healing process may be performed by exposing the inorganic layer 4 to a chamber having an oxygen partial pressure in the range of about 2% to about 100%, for example, an oxygen partial pressure in the air, and a temperature in the range of about 25° C. to about 150° C.

In another embodiment, the second healing process may be performed by exposing the inorganic layer 4 to a chamber having an oxygen partial pressure in the range of about 2% to about 100%, for example, an oxygen partial pressure in the air, a relative humidity in the range of about 10% to about 100%, and a temperature in the range of about 25° C. to about 150° C.

The oxygen partial pressure is represented with respect to 100% of the pressure of the chamber.

In several embodiments, the healing process may not include the above-described two steps, and only the first healing process may be performed.

In various embodiments, the transiting may also be performed by irradiating the pre-inorganic layer 4" with laser beams, and then scanning the pre-inorganic layer 4" with the laser beams. That is, the transiting may be performed by increasing the temperature of the pre-inorganic layer 4" by irradiating the pre-inorganic layer 4" with laser beams, and accordingly providing fluidity to the pre-inorganic layer 4".

Then, as shown in FIG. 6H, a laser beam is applied from the outside of the second substrate 11 to irradiate the second organic layer 32 to separate the second organic layer 32 from the second substrate 11. The laser beam may be focused on the interface between the second substrate 11 and the second organic layer 32 by adjusting a depth of the laser beam, and irradiated to the entire surface of the upper surface of the second substrate 11. For example, the laser beam may have a wavelength of 308 nm generally used in an excimer laser annealing (ELA) process that is a silicon crystallization process. In this regard, since the surface of the second organic layer 32 absorbs the laser beam at the interface between the second organic layer 32 and the second substrate 11, the surfaces thereof are partially burned so that the second substrate 11 and the second organic layer 32 are separated from each other.

In order to rectify or repair edge defects or separation defects generated in the separation process of the second substrate 11 and the second organic layer 32, a heat-treatment may further be performed after the laser beam is irradiated.

Figure 6I:
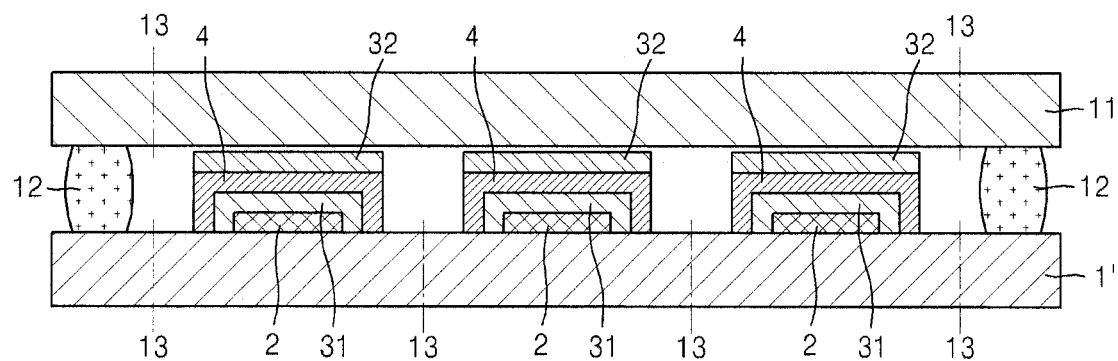
Figure 6J:
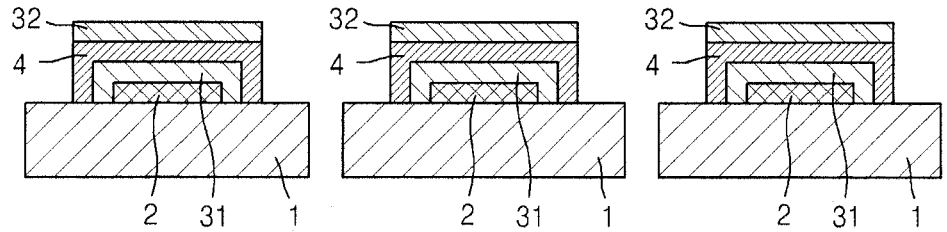

Then, as shown in FIG. 6I, the second substrate 11 and the mother substrate 1' are cut along cutting lines 13 to prepare individual devices as shown in FIG. 6J.

Then, although not shown herein, a separate organic layer may further be formed to cover the inorganic layer 4 and/or the second organic layer 32. If the separate organic layer is formed to cover the inorganic layer 4 and/or the second organic layer 32, bending characteristics and structural strength of the organic light-emitting device may be improved. The formation of the organic layer may be applied to the mother substrate 1' right after the second substrate 11 is separated therefrom or to individual devices. Examples of the organic material include an acrylic organic material or a polyimide that may or may not be transparent.

The formation of the inorganic layer 4 performed using the second substrate 11 via transition may be more efficient than a method of directly forming the inorganic layer 4. That is, since the second substrate 11 on which the pre-inorganic layer is formed is prepared using a different process and/or in a separate location from the mother substrate 1' on which the organic emission unit is formed, and then the inorganic layer is transited by bonding the second substrate 11 and the mother substrate 1', productivity may be improved and/or processing time may be reduced when compared with a process of directly forming the pre-inorganic layer on the mother substrate 1' on which the organic emission unit is formed. This effect may also be obtained according to the following embodiments.

Here, the second substrate 11 and the mother substrate 1' are separated from each other according to the previous embodiment, but the present invention is not limited thereto. If desired, the bonding between the second substrate 11 and the mother substrate 1' may be maintained.

Figure 7:
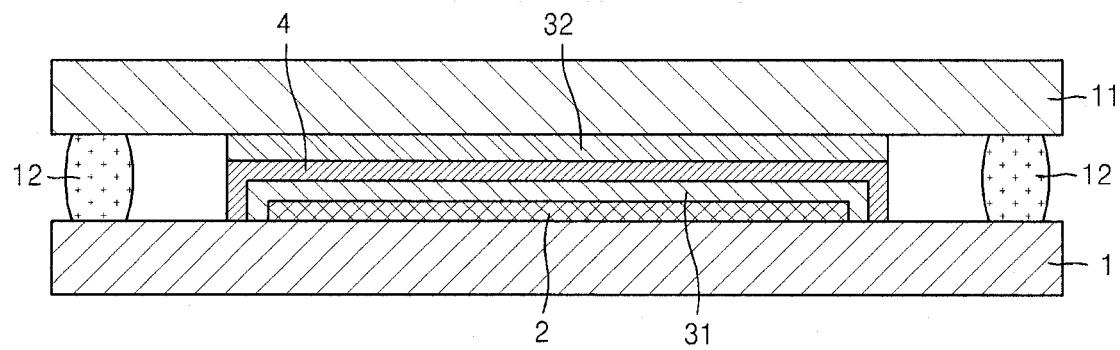
FIG. 7 is a schematic cross-sectional view of an organic light-emitting device according to another embodiment of the present invention.

For example, as shown in FIG. 7, the first substrate 1 and the second substrate 11 are fixed to each other by disposing the adhesive 12 to surround the organic emission unit 2. In this regard, the bonding between the second substrate 11 and the second organic layer 32 may be maintained. Accordingly, sealing characteristics may further be improved, and the second substrate 11 may provide additional strength.

Figure 8:
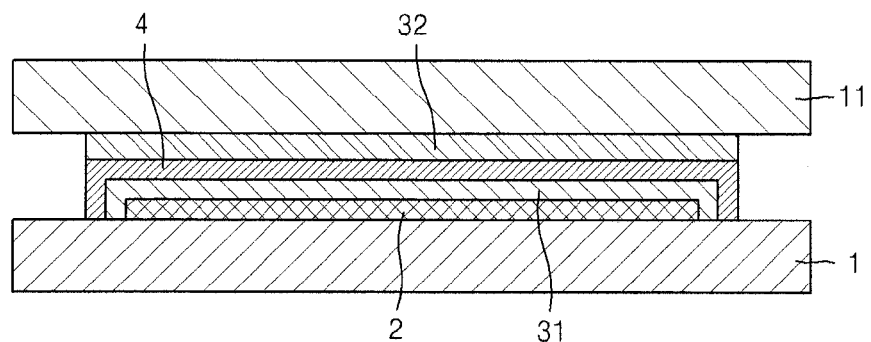
FIG. 8 is a schematic cross-sectional view of an organic light-emitting device according to another embodiment of the present invention.

For example, as shown in FIG. 8, the second substrate 11 may be cut and maintained in a state bonded to the second organic layer 32. In this case, the second substrate 11 may provide additional strength.

As such, if the second substrate 11 is not separated from the mother substrate 1', the laser beam does not pass through the second substrate 11, so that the second substrate 11 may not be transparent. Accordingly, the second substrate 11 may be an opaque glass substrate, a plastic substrate, or a metallic substrate.

Figure 9:
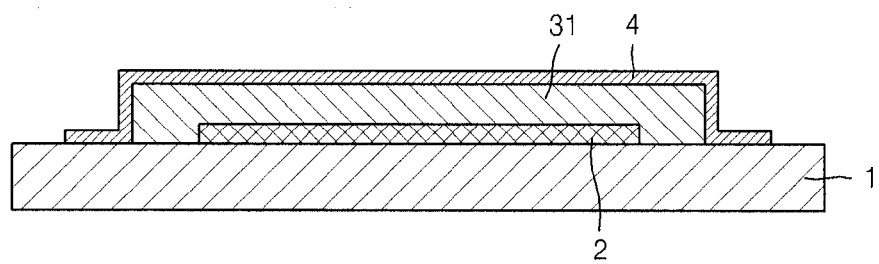
FIG. 9 is a schematic cross-sectional view of an organic light-emitting device according to another embodiment of the present invention.

FIG. 9 is a schematic cross-sectional view of an organic light-emitting device according to another embodiment of the present invention.

The organic light-emitting device of FIG. 9 does not include the second organic layer 32 of FIG. 1, but includes a first organic layer 31 that covers the organic emission unit 2 and an inorganic layer 4 that covers the first organic layer 31.

FIGS. 10A to 10H are diagrams for describing a method of preparing the organic light-emitting device of FIG. 9. Description of the organic light-emitting device which are the same as those shown in FIGS. 6A to 6J will not be repeated here.

Figure 10A:
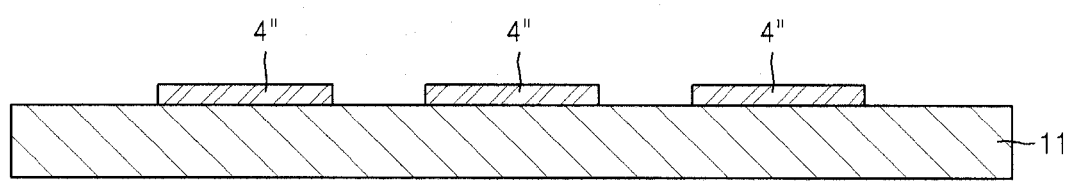
FIGS. 10A through 10H are diagrams for describing a method of preparing the organic light-emitting device of FIG. 9.

First, as shown in FIG. 10A, at least one pre-inorganic layer 4" is formed on the second substrate 11. The pre-inorganic layer 4" is described above. In this regard, the pre-inorganic layer 4" may further include a material having a laser beam absorption property such that it can be separated from the second substrate 11, which will be described below. The second substrate 11 formed of a glass material may absorb laser beams having different wavelengths.

Figure 10B:
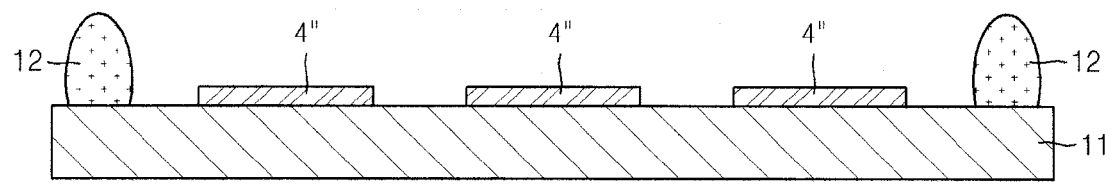

Then, as shown in FIG. 10B, the adhesive 12 is applied to edge portions of the second substrate 11.

Figure 10C:
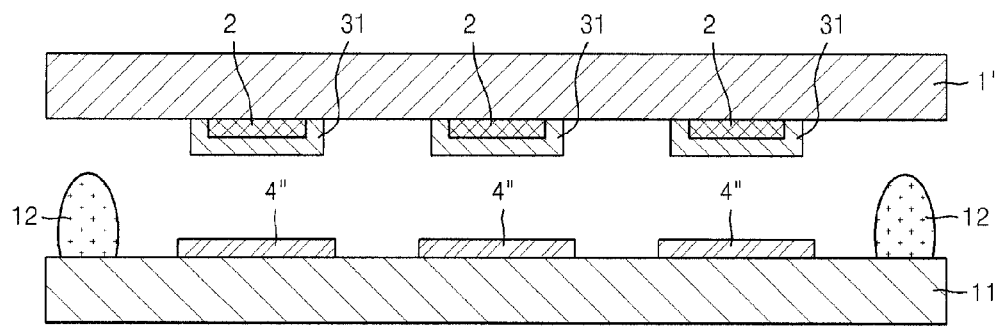

As shown in FIG. 10C, a mother substrate 1' on which the organic emission units 2 and the first organic layers 31 are formed is prepared, and then the mother substrate 1' is disposed opposite to the second substrate 11.

Figure 10D:
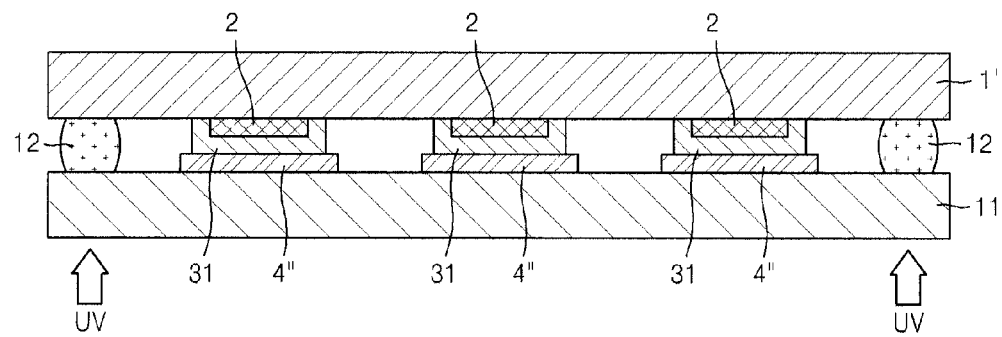

Then, as shown in FIG. 10D, the mother substrate 1' and the second substrate 11 are bonded in a vacuum, and UV rays are irradiated thereto to cure the adhesive 12. In this regard, each of the first organic layers 31 is in contact with a corresponding one of the pre-inorganic layers 4".

Figure 10E:
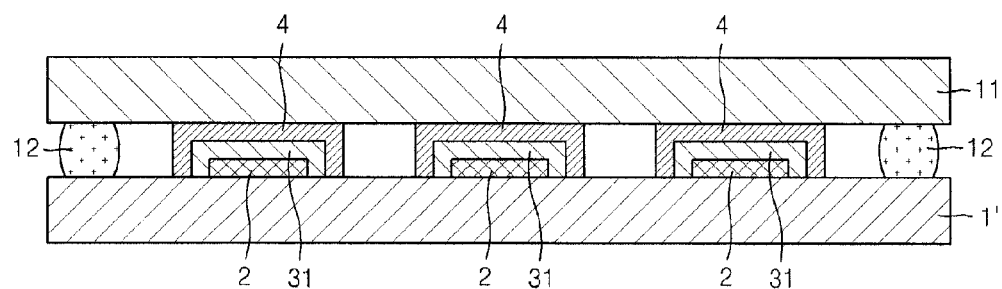

Then, as shown in FIG. 10E, the pre-inorganic layers 4" having fluidity by a transition process cover the first organic layers 31 to form the inorganic layers 4 that are in contact with the surface of the mother substrate 1'.

Figure 10F:
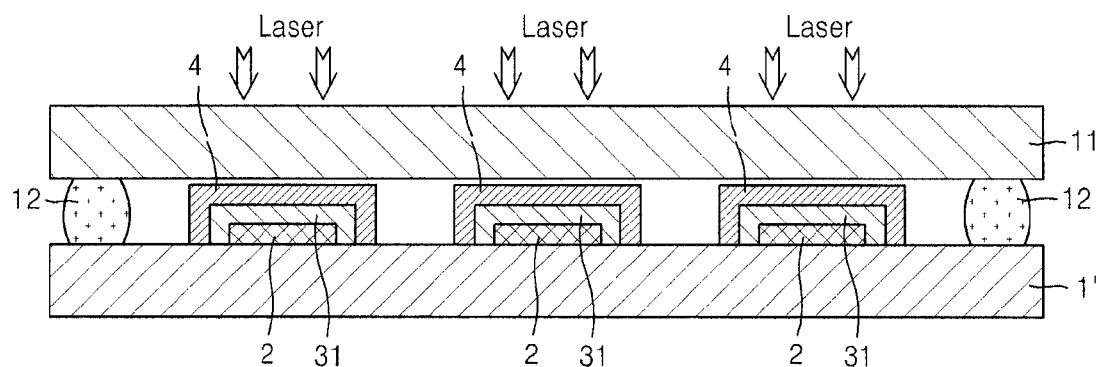

As shown in FIG. 10F, the interface between the second substrate 11 and the inorganic layer 4 is irradiated with a laser beam to separate the inorganic layer 4 from the second substrate 11.

Figure 10G:
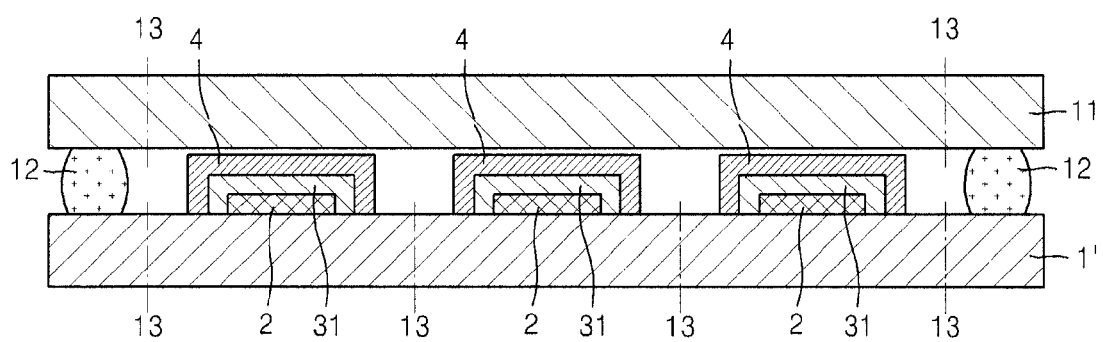
Figure 10H:
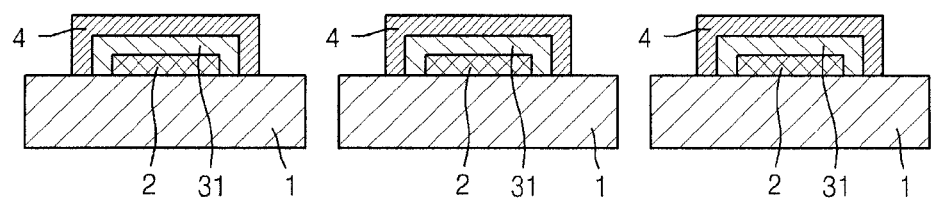

Then, as shown in FIG. 10G, the second substrate 11 and the mother substrate 1' are cut along cutting the lines 13 to prepare individual devices as shown in FIG. 10H.

Then, although not shown herein, a separate organic layer may further be formed to cover the inorganic layer 4. In this regard, the organic light-emitting device may have the same structure as that of FIG. 4. If the separate organic layer is formed to cover the inorganic layer 4, bending characteristics and structural strength of the organic light-emitting device may be improved. The formation of the organic layer may be applied to the mother substrate 1' right after the second substrate 11 is separated therefrom or to individual devices. Examples of the organic material may include an acrylic organic material or a polyimide that may or may not be transparent.

The second substrate 11 and the mother substrate 1' can be separated from each other similar to the previous embodiment, but the present invention is not limited thereto. If desired, the bonding state between the second substrate 11 and the mother substrate 1' may be maintained.

Figure 11:
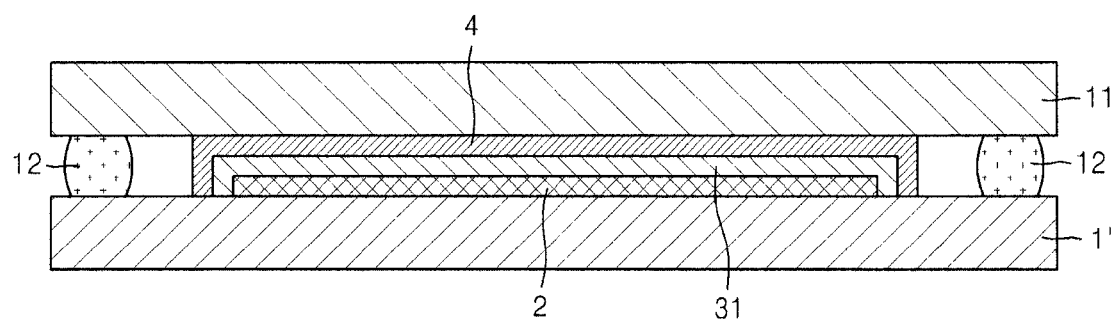
FIG. 11 is a schematic cross-sectional view of an organic light-emitting device according to another embodiment of the present invention.

For example, as shown in FIG. 11, the first substrate 1' and the second substrate 11 are fixed to each other by disposing the adhesive 12 to surround the organic emission unit 2. In this regard, the bonding state between the second substrate 11 and the inorganic layer 4 may be maintained. Accordingly, sealing characteristics may further be improved, and the second substrate 11 may provide additional strength.

Figure 12:
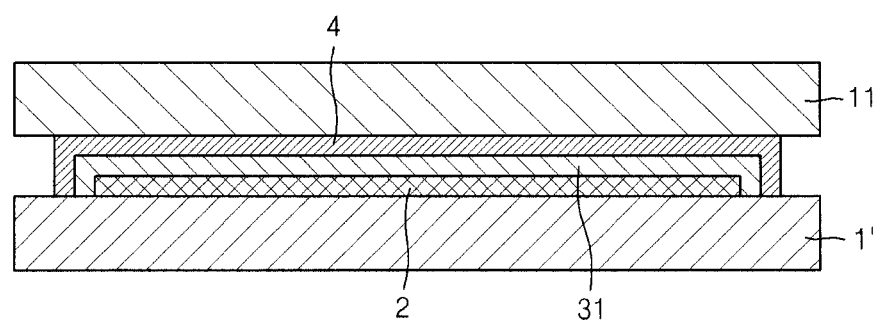
FIG. 12 is a schematic cross-sectional view of an organic light-emitting device according to another embodiment of the present invention.

In one embodiment, as shown in FIG. 12, the second substrate 11 may be cut and maintained in a state bonded to the inorganic layer 4. In this case, the second substrate 11 may provide additional strength.

Figure 13:
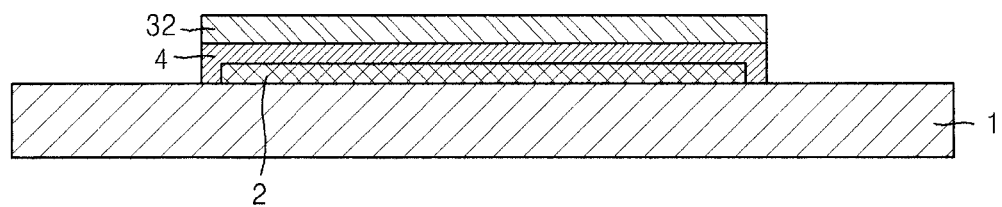
FIG. 13 is a schematic cross-sectional view of an organic light-emitting device according to another embodiment of the present invention.

FIG. 13 is a schematic cross-sectional view of an organic light-emitting device according to another embodiment of the present invention.

The organic light-emitting device of FIG. 13 does not include the first organic layer of 31 FIG. 1, but includes an inorganic layer 4 that covers the organic emission unit 2 and a second organic layer 32 that covers the inorganic layer 4.

FIGS. 14A to 14I are diagrams for describing a method of preparing the organic light-emitting device of FIG. 13. Descriptions of the organic light-emitting device which are the same as those shown in FIGS. 6A to 6J will not be repeated here.

Figure 14A:
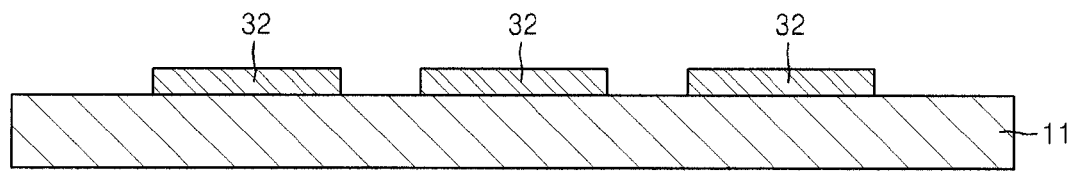
FIGS. 14A through 14I are diagrams for describing a method of preparing the organic light-emitting device of FIG. 13.
Figure 14B:
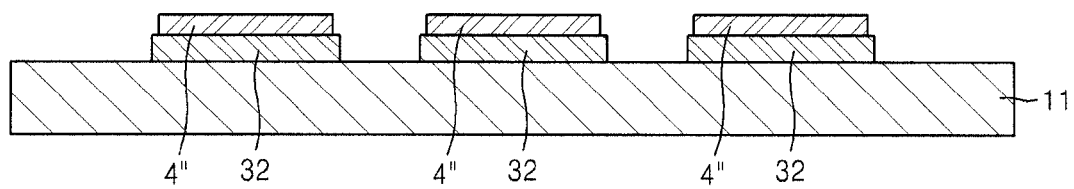

First, as shown in FIG. 14A, at least one second organic layer 32 is formed on the second substrate 11. Then, pre-inorganic layers 4" are formed on the second organic layers 32 as shown in FIG. 14B. The pre-inorganic layers 4" are described above.

Figure 14C:
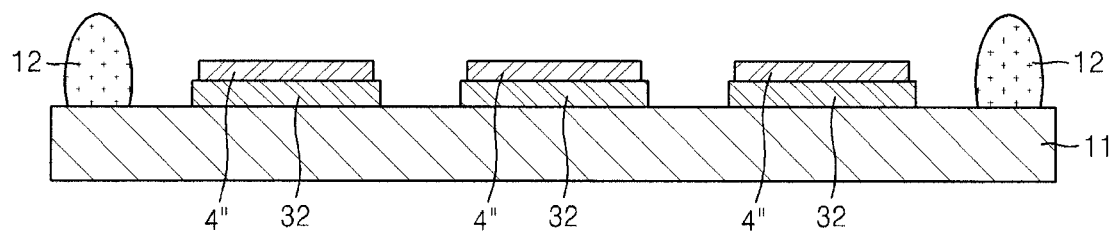

Then, as shown in FIG. 14C, the adhesive 12 is applied to edge portions of the second substrate 11.

Figure 14D:
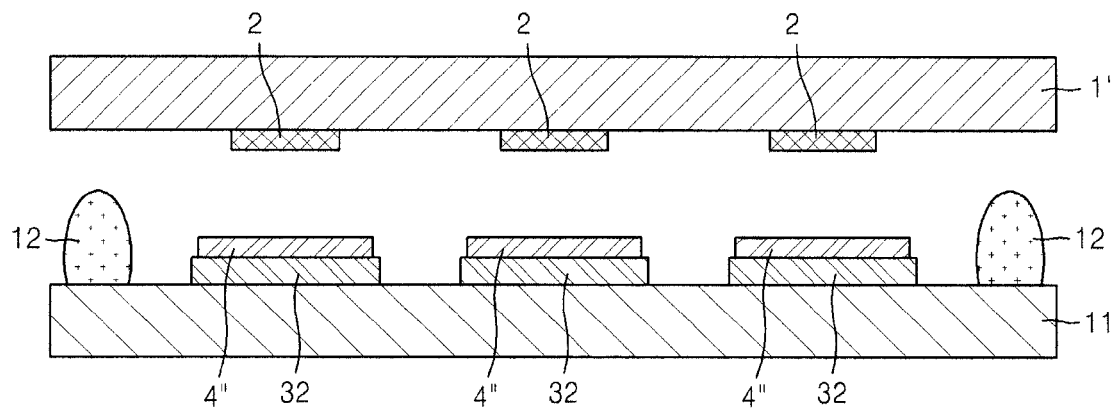

As shown in FIG. 14D, a mother substrate 1' on which the organic emission unit 2 is formed is prepared, and then the mother substrate 1' is disposed opposite to the second substrate 11.

Figure 14E:
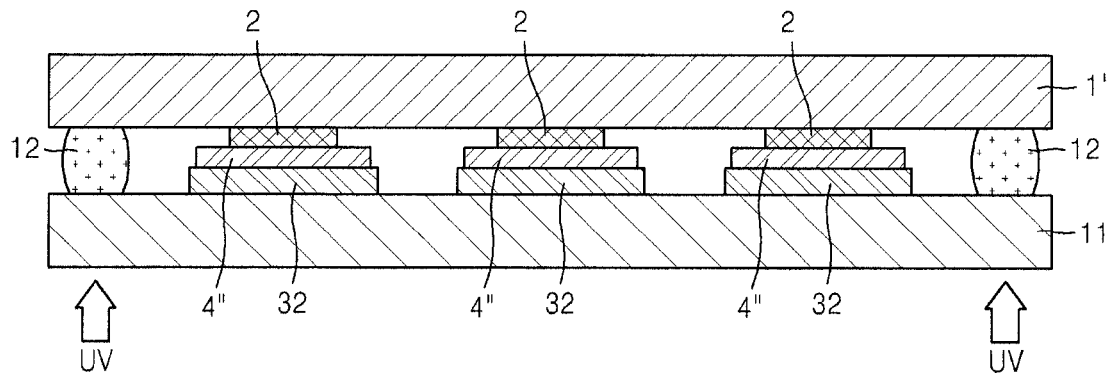

Then, as shown in FIG. 14E, the mother substrate 1' and the second substrate 11 are bonded to each other in a vacuum, and UV rays are irradiated thereto to cure the adhesive 12. In this regard, each of the organic emission units 2 is in contact with a corresponding one of the pre-inorganic layers 4".

Figure 14F:
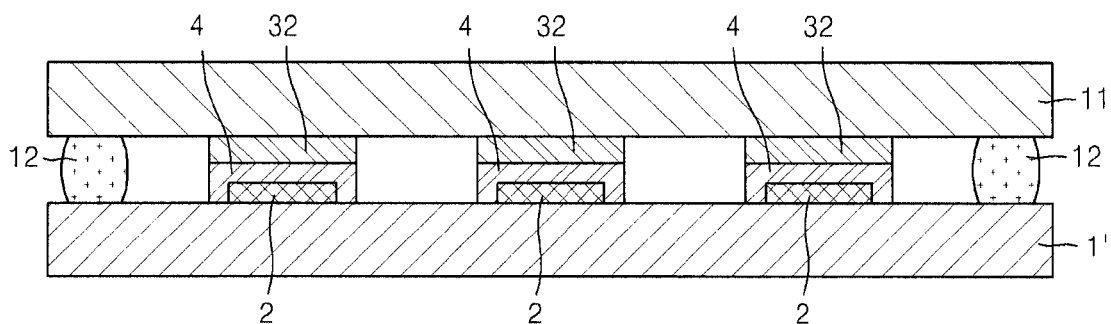

Then, as shown in FIG. 14F, the pre-inorganic layers 4" having fluidity by a transition process cover the organic emission units 2 to form the inorganic layers 4 that are in contact with the surface of the mother substrate 1'.

Figure 14G:
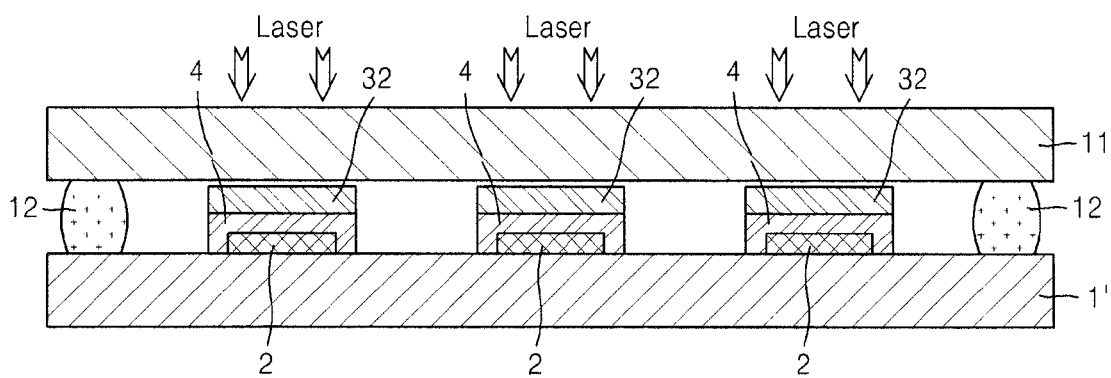

As shown in FIG. 14G, the interface between the second substrate 11 and the second organic layer 32 is irradiated with a laser beam to separate the second organic layer 32 from the second substrate 11.

Figure 14H:
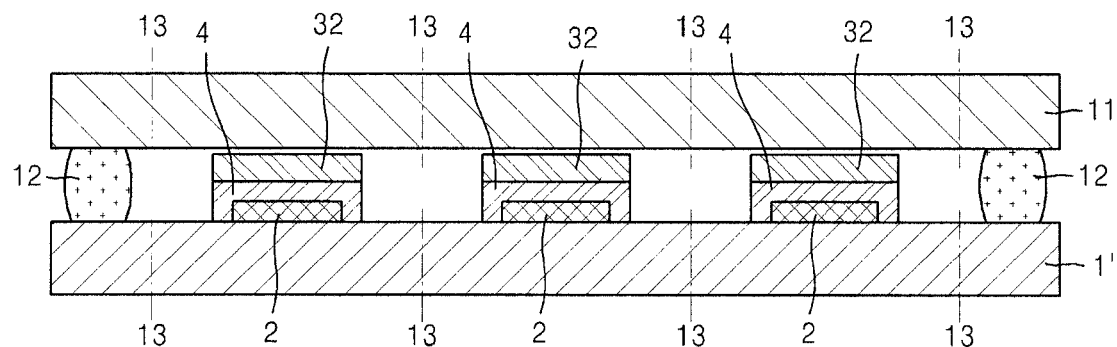
Figure 14I:
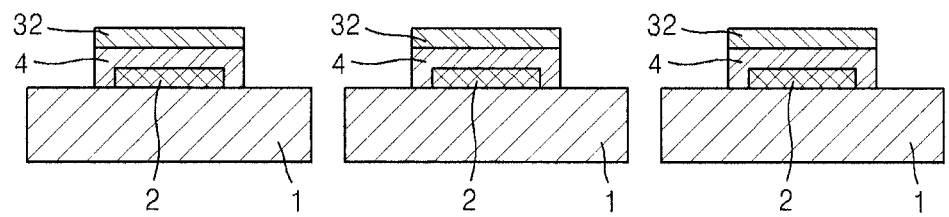

Then, as shown in FIG. 14H, the second substrate 11 and the mother substrate 1' are cut along cutting lines 13 to prepare individual devices as shown in FIG. 14I.

Then, although not shown herein, a separate organic layer may further be formed to cover the inorganic layer 4 and/or the second organic layer 32. If the separate organic layer is formed to cover the inorganic layer 4 and/or the second organic layer 32, bending characteristics and structural strength of the organic light-emitting device may be improved. The formation of the organic layer may be applied to the mother substrate 1' right after the second substrate 11 is separated therefrom or to individual devices. Examples of the organic material may include an acrylic organic material or a polyimide that may or may not be transparent.

Here, the second substrate 11 and the mother substrate 1' can be separated from each other similar to the previous embodiment, but the present invention is not limited thereto. If desired, the bonding state between the second substrate 11 and the mother substrate 1' may be maintained.

Figure 15:
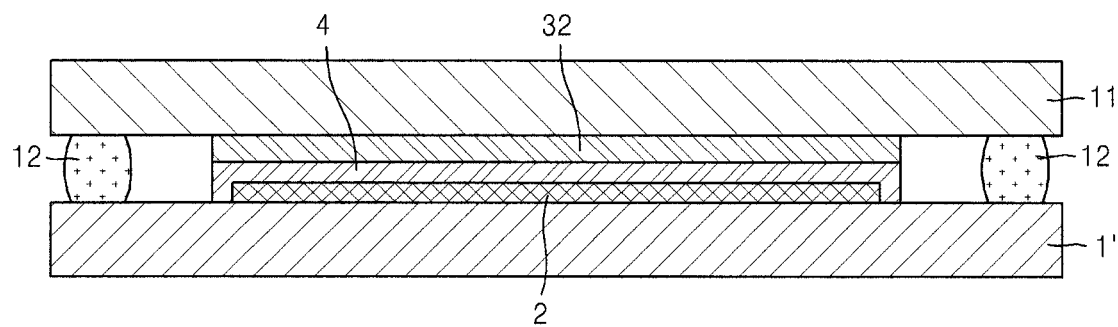
FIG. 15 is a schematic cross-sectional view of an organic light-emitting device according to another embodiment of the present invention.

In one embodiment, as shown in FIG. 15, the first substrate 1 and the second substrate 11 are fixed to each other by disposing the adhesive 12 to surround the organic emission unit 2. In this regard, the bonding state between the second substrate 11 and the second organic layer 32 may be maintained. Accordingly, sealing characteristics may further be improved, and the second substrate 11 may provide additional strength.

Figure 16:
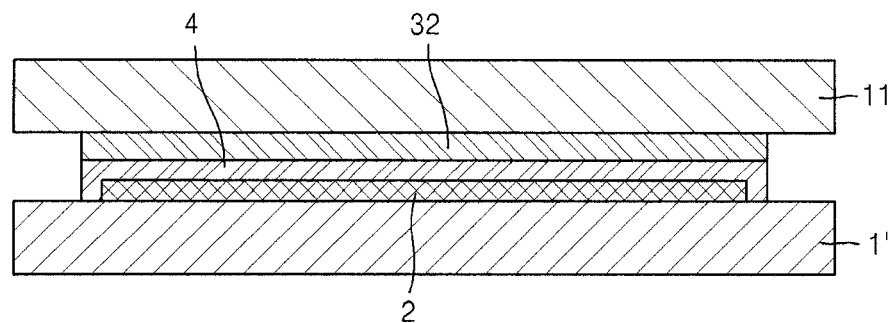
FIG. 16 is a schematic cross-sectional view of an organic light-emitting device according to another embodiment of the present invention.

In one embodiment, as shown in FIG. 16, the second substrate 11 may be cut and maintained in a state bonded to the second organic layer 32. In this case, the second substrate 11 may provide additional strength.

As such, when the second substrate 11 is not separated from the mother substrate 1', the laser beam does not pass through the second substrate 11, so that the second substrate 11 may not be transparent. Accordingly, the second substrate 11 may be an opaque glass substrate, a plastic substrate, or a metallic substrate.

Figure 17:
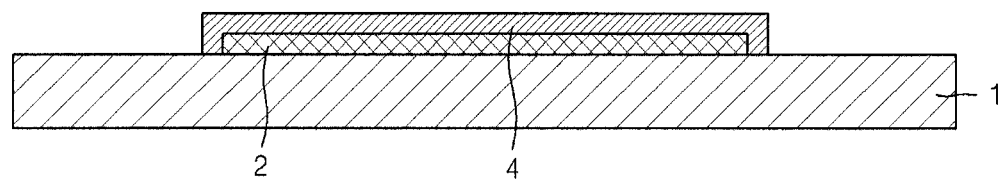
FIG. 17 is a schematic cross-sectional view of an organic light-emitting device according to another embodiment of the present invention.

FIG. 17 is a schematic cross-sectional view of an organic light-emitting device according to another embodiment of the present invention.

The organic light-emitting device of FIG. 17 does not include the first organic layer 31 of FIG. 7, but includes an inorganic layer 4 that covers the organic emission unit 2.

FIGS. 18A to 18H are diagrams for describing a method of preparing the organic light-emitting device of FIG. 17.

Description of the organic light-emitting device which are the same as those shown in FIGS. 8A to 8H will not be repeated here.

Figure 18A:
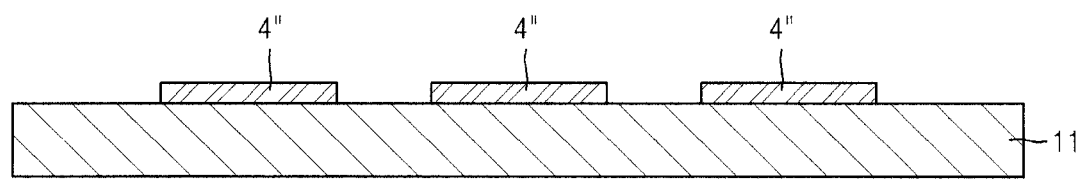
FIGS. 18A through 18H are diagrams for describing a method of preparing the organic light-emitting device of FIG. 17.

First, as shown in FIG. 18A, at least one pre-inorganic layer 4" is formed on the second substrate 11. The pre-inorganic layer 4" is described above. In this regard, the pre-inorganic layer 4" may further include a material having a laser beam absorption property such that it can be separated from the second substrate 11, which will be described below. The second substrate 11 formed of a glass material may absorb laser beams having different wavelengths.

Figure 18B:
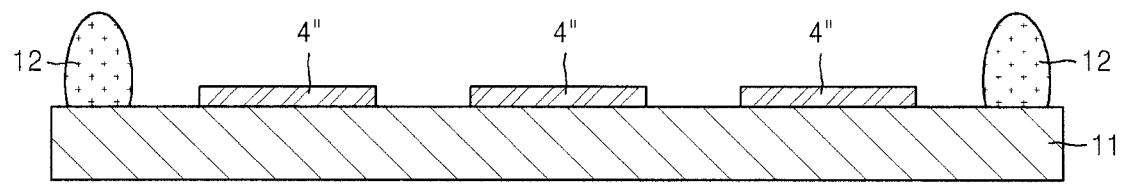

Then, as shown in FIG. 18B, the adhesive 12 is applied to edge portions of the second substrate 11.

Figure 18C:
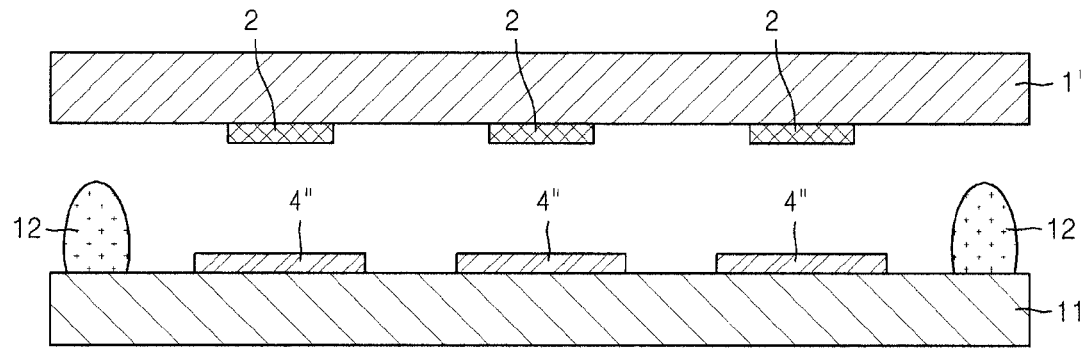

As shown in FIG. 18C, a mother substrate 1' on which the organic emission units 2 are formed is prepared, and the mother substrate 1' is disposed opposite to the second substrate 11.

Figure 18D:
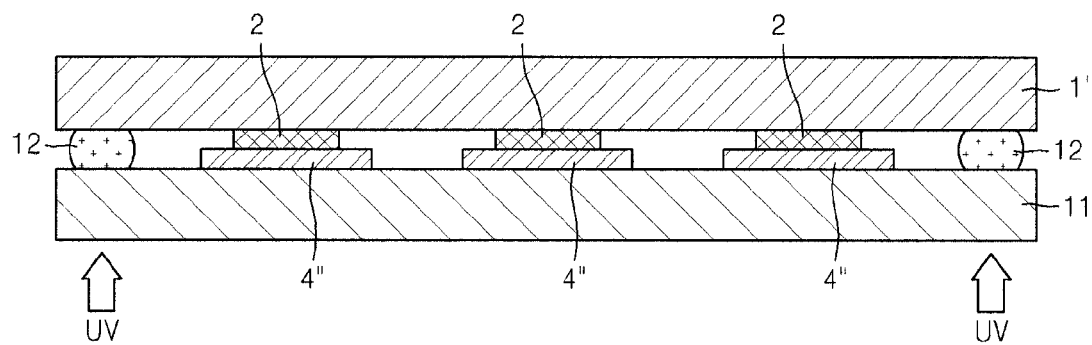

Then, as shown in FIG. 18D, the mother substrate 1' and the second substrate 11 are bonded to each other in a vacuum, and UV rays are irradiated thereto to cure the adhesive 12. In this regard, each of the organic emission units 2 is in contact with a corresponding one of the pre-inorganic layers 4".

Figure 18E:
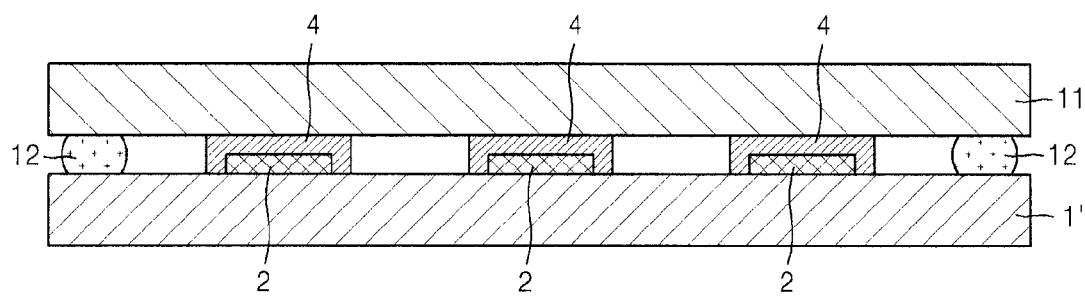

Then, as shown in FIG. 18E, the pre-inorganic layers 4" having fluidity by a transition process cover the organic emission units 2 to form the inorganic layers 4 that are in contact with the surface of the mother substrate 1'.

Figure 18F:
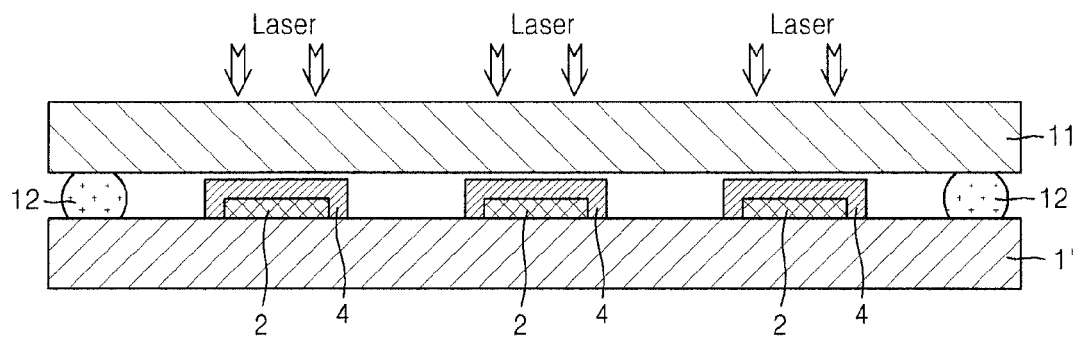

As shown in FIG. 18F, the interface between the second substrate 11 and the inorganic layer 4 is irradiated with a laser beam to separate the inorganic layer 4 from the second substrate 11.

Figure 18G:
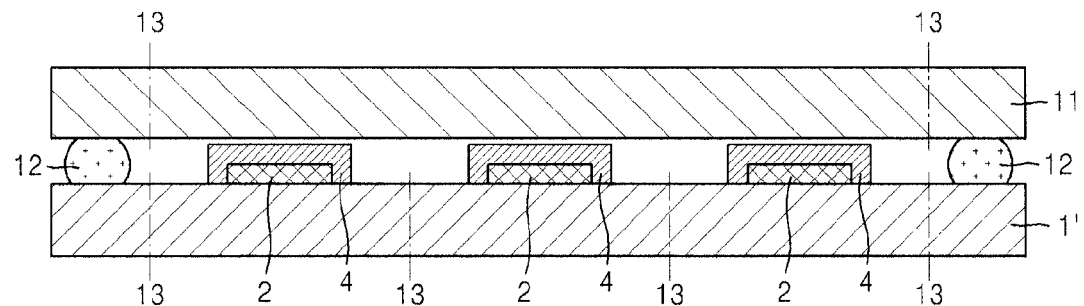
Figure 18H:
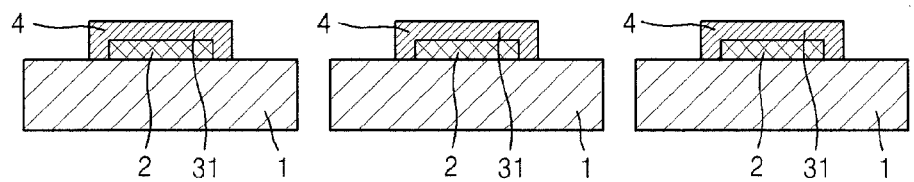

Then, as shown in FIG. 18G, the second substrate 11 and the mother substrate 1' are cut along cutting lines 13 to prepare individual devices as shown in FIG. 18H.

Then, although not shown herein, a separate organic layer may further be formed to cover the inorganic layer 4.

If the separate organic layer is formed to cover the inorganic layer 4, bending characteristics and structural strength of the organic light-emitting device may be improved. The formation of the organic layer may be applied to the mother substrate 1' right after the second substrate 11 is separated therefrom or to individual devices. Examples of the organic material may include an acrylic organic material or a polyimide that may or may not be transparent.

Here, the second substrate 11 and the mother substrate 1' can be separated from each other similar to the previous embodiment, but the present invention is not limited thereto. If desired, the bonding state between the second substrate 11 and the mother substrate 1' may be maintained.

Figure 19:
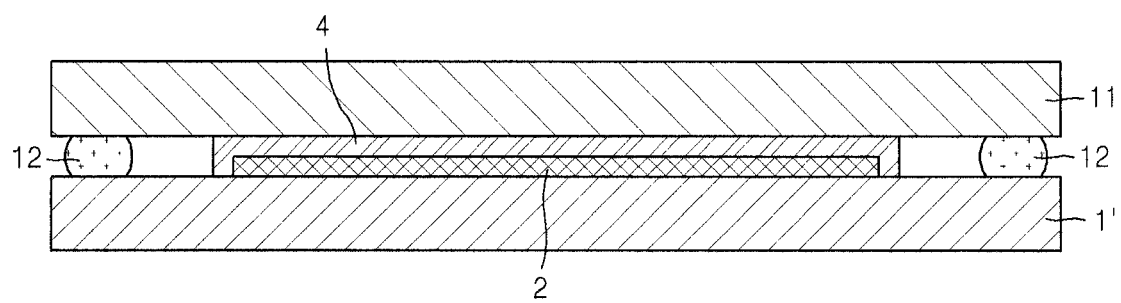
FIG. 19 is a schematic cross-sectional view of an organic light-emitting device according to another embodiment of the present invention.

In one embodiment, as shown in FIG. 19, the mother substrate 1' and the second substrate 11 are fixed to each other by disposing the adhesive 12 to surround the organic emission unit 2. In this regard, the bonding state between the second substrate 11 and the inorganic layer 4 may be maintained. Accordingly, sealing characteristics may further be improved, and the second substrate 11 may provide additional strength.

Figure 20:
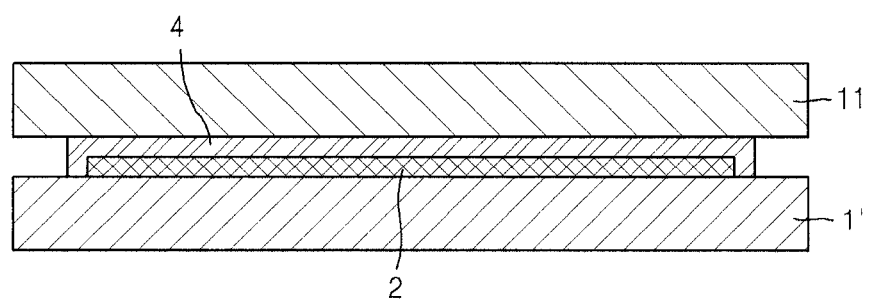
FIG. 20 is a schematic cross-sectional view of an organic light-emitting device according to another embodiment of the present invention.

In one embodiment, as shown in FIG. 20, the second substrate 11 may be cut and maintained in a state bonded to the inorganic layer 4. In this case, the second substrate 11 may provide additional strength.

As such, when the second substrate 11 is not separated from the mother substrate 1', the laser beam does not pass through the second substrate 11, so that the second substrate 11 may not be transparent. Accordingly, the second substrate 11 may be an opaque glass substrate, a plastic substrate, or a metallic substrate.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A substrate comprising:
a second substrate;
at least one inorganic layer on one surface of the second substrate and comprising a low temperature viscosity transition (LVT) inorganic material comprising a tin oxide; and
at least one organic layer between the at least one inorganic layer and the second substrate,
wherein the at least one organic layer contacts the second substrate, and
wherein the substrate is configured to transit the at least one inorganic layer onto an organic layer coating an organic emission unit on a first substrate to produce an organic light-emitting device.

2. The substrate of claim 1, wherein the at least one organic layer comprises a heat-resistant organic material.

3. The substrate of claim 1, wherein the viscosity transition temperature of the LVT inorganic material is a minimum temperature capable of providing fluidity to the LVT inorganic material.

4. The substrate of claim 1, wherein the LVT inorganic material further comprises at least one selected from the group consisting of a phosphorus oxide, a boron phosphate, a tin fluoride, a niobium oxide, and a tungsten oxide.

5. The substrate of claim 1, wherein the LVT inorganic material comprises SnO; SnO and $P_2O_5$; SnO and $BPO_4$; SnO, $SnF_2$, and $P_2O_5$; SnO, $SnF_2$, $P_2O_5$, and NbO; or SnO, $SnF_2$, $P_2O_5$, and $WO_3$.

6. The substrate of claim 1, wherein the second substrate comprises glass, plastic, or metal.

7. An organic light-emitting device comprising:
a first substrate;
an organic emission unit on one surface of the first substrate;
an inorganic layer comprising a low temperature viscosity transition (LVT) inorganic material comprising a tin oxide, the inorganic layer covering the organic emission unit and contacting the first substrate;
a first organic layer between the inorganic layer and the organic emission unit; and
a second substrate on and attached to the inorganic layer and facing the first substrate.

8. The organic light-emitting device of claim 7, wherein the inorganic layer is transited onto the organic emission unit to cover the organic emission unit.

9. The organic light-emitting device of claim 7, wherein the inorganic layer is transited to the first organic layer to cover the first organic layer.

10. The organic light-emitting device of claim 7, further comprising a second organic layer between the second substrate and the inorganic layer.

11. The organic light-emitting device of claim 7, further comprising an adhesive between the first substrate and the second substrate and disposed outside of the organic emission unit.

12. The organic light-emitting device of claim 7, wherein the viscosity transition temperature of the LVT inorganic material is a minimum temperature capable of providing fluidity to the LVT inorganic material.

13. The organic light-emitting device of claim 7, wherein the LVT inorganic material further comprises at least one selected from the group consisting of a phosphorus oxide, a boron phosphate, a tin fluoride, a niobium oxide, and a tungsten oxide.

14. The organic light-emitting device of claim 7, wherein the LVT inorganic material comprises SnO; SnO and $P_2O_5$; SnO and $BPO_4$; SnO, $SnF_2$, and $P_2O_5$; SnO, $SnF_2$, $P_2O_5$, and NbO; or SnO, $SnF_2$, $P_2O_5$, and $WO_3$.

15. The organic light-emitting device of claim 7, wherein the second substrate comprises glass, plastic, or metal.

* * * * *